(12) United States Patent
Katagiri et al.

(10) Patent No.: US 6,359,724 B1
(45) Date of Patent: Mar. 19, 2002

(54) LIGHT GENERATION METHOD AND LIGHT SOURCE

(75) Inventors: Yoshitada Katagiri; Shinji Nagaoka; Fumikazu Ohira, all of Tokyo; Ken-ichi Suzuki, Kanagawa; Masamichi Fujiwara, Kanagawa; Noboru Takachio, Kanagawa, all of (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 0 days.

(21) Appl. No.: 09/482,165

(22) Filed: Jan. 12, 2000

(30) Foreign Application Priority Data

| Jan. 14, 1999 | (JP) | ............................................ 11-007724 |
| May 21, 1999 | (JP) | ............................................ 11-141955 |
| Dec. 20, 1999 | (JP) | ............................................ 11-361728 |

(51) Int. Cl.[7] ................................................. H01S 3/00
(52) U.S. Cl. ........................................ 359/333; 359/188
(58) Field of Search ................................... 359/124, 180, 359/188, 341, 333

(56) References Cited

U.S. PATENT DOCUMENTS 6,195,200 B1 * 2/2001 DeMarco et al. ............ 359/341
6,219,163 B1 * 4/2001 Miyazaki et al. ........... 359/124

OTHER PUBLICATIONS

"Optical Amplifiers and Their Applications", Kiyoshi Nakagawa et al., published by Ohm Co., Ltd, 1992.
"Light Wave Electronic Engineering", Jiro Koyama et al., published by Corona Co., Ltd, 1978.
"Low Loss Tunable Integrated Acoustooptical Wavelength Filter in LiNbO$_3$ with Strong Sidelobe Supression", IEEE Photonics Technology Letters, vol. 10, No. 1, Jan. 1998, pp. 120–122, H. Herrmann.

Y. Yamamoto, N. Imoto, and S.Machida, "Amplitude squeezing in a semiconductor laser using quantum nondemolition measurement and negative feedback",Physical Review A, Vol. 33, No., May 1986, pp. 3243–3261.
Yoshitada Katagiri, et al., "Synchro–Scanned Rotating Tunable Optical Disk Filter for Wavelength Discrimination", IEEE Photonics Technology Letters, vol. 10, No. 3, Mar. 1998, pp. 400–402.
K. I. Suzuki, et al., "Suppression of Four Wave Mixing near Zero Dispersion Wavelength Utilizing Novel Intensity–Stabilized Incoherent Monochromatic Light Source", 2 pages.
Jung–Hee Han, et al., "0.1–nm Narrow Bandwidth Transmission of a 2.5 Gb/s Spectrum–Sliced Incoherent Light Channel Using an All–Optical Bandwidth Expansion Technique at the Receiver", IEEE Photonics Technology Letters, vol. 10, No. 10, Oct. 1998. pp. 1501–1503.

* cited by examiner

Primary Examiner—Mark Hellner
(74) Attorney, Agent, or Firm—Fitch, Even, Tabin & Flannery

(57) ABSTRACT

The present invention provides a light generation method and a light source that are preferable in obtaining a single-mode light having high outputs, a small wavelength spectral bandwidth, and a low intensity noise. A white output from a white-light source and having wavelength components over a wide-band in a wavelength spectrum passes through an isolator and is then filtered by a disc-shaped optical filter. A transmitted light is input to a semiconductor optical amplifier having its polarization plane regulated by a polarization controller. An output from the amplifier passes through an isolator and is then filtered by a disc-shaped optical filter again to generate a single-mode light having a small spectral bandwidth and high outputs. Polarization control by the polarization controller corresponds to control of the polarization plane of a semiconductor laser in the semiconductor optical amplifier so as to obtain a maximum gain from the amplifier. This configuration enables a single-mode light having a small spectral bandwidth and high outputs to be easily generated at an arbitrary wavelength.

46 Claims, 21 Drawing Sheets

LIGHT GENERATION METHOD AND LIGHT SOURCE

This application is based on Japanese Patent Application Nos. 11-7724 (1999) filed Jan. 14, 1999, 11-141955 (1999) filed May 21, 1999, and 11-361728 filed Dec. 20, 1999, the contents of which are incorporated hereinto by reference.

BACKGROUND OF THE INVENTION

1. Field of the Invention

The present invention relates to a light generation method and a light source for generating a single-mode incoherent light having a low intensity noise and a small spectral bandwidth, and more particularly, to a light generation method and a light source for using a wavelength-tunable optical filter to output a single-mode light having wavelength components in a particular band of a white-light band by obtaining this single-mode light from a white-light having wavelength components over a wide-band in a wavelength domain.

2. Description of the Related Art

Single-mode light sources are configured to obtain a single-mode light by using an optical filter to spectrum-slice a white-light having an emission spectrum spreading over a wide-band in a wavelength domain. The single-mode light refers to a light showing a uni-modal spectrum distribution around a particular wavelength.

In addition, the white-light refers to a light having continuous spectral components over a wide-band in a wavelength domain and is also referred to as a Gauss light.

A conventional single-mode light source of this kind is typically comprised of a white-light source 81 and an optical filter 90 as shown in FIG. 21, and also has an isolator 82 located in an output section of the white-light source 81 for preventing an unwanted light returning from the optical filter 90. That is, such a light source is comprised of the wide-band white-light source 81 for generating a wide-band white-light, the wavelength-tunable optical filter 90 having a particular transmission band, and the isolator 82 for preventing an unwanted light returning from the wavelength-tunable optical filter 90 so that a white-light from the wide-band white-light source 81 is filtered when it passes through the wavelength-tunable optical filter 90 via the isolator 82.

The white-light source 81 may be comprised of an incandescent lamp, a super luminescent diode (SLD), or an amplified spontaneous emission (ASE) generated from an optical amplifier. The optical filter 90 may be comprised of a dielectric multilayer film filter, an acoustooptical filter, or a grating monochromator.

A white-light from the white-light source 81 has wavelength components over a wide-band in a wavelength domain. The single-mode light source for obtaining a single-mode light by spectrum-slicing a white-light using the wavelength-tunable optical filter is a mode-hop-free light source that replaces a wavelength-tunable single-mode laser light source, and is conventionally used not only for optical measurements but also as a simple light source for telecommunications systems based on wavelength-division multiplexing (WDH). The spectrum slicing refers to transmitting a white-light through the wavelength-tunable optical filter to obtain a single-mode light having wavelength components in a particular narrow band of the white-light band.

FIG. 22 shows a mechanism for obtaining a single-mode light by using a filter to spectrum-slice an arbitrary center transmission wavelength of a wide-band white-light. As shown in this figure, the spectral shape of a sliced single-mode light reflects a transmission wavelength characteristic of the filter, but the use of an optical filter having a tunable transmission wavelength enables the center transmission wavelength to be controlled using only the optical filter.

In addition, some single-mode light sources are comprised of a combination of a white-light source and an optical filter to spectrum-slice a single-mode light of a selected wavelength from a wide-band white-light. The wide-band white-light source may be comprised, for example, of an amplified spontaneous emission (ASE) generated from an optical fiber amplifier typically including an erbium-doped fiber amplifier (EDFA). Since a spectrum of an ASE from an optical fiber amplifier generally has no fine structure, a single-mode light can be obtained which has an arbitrary center transmission wavelength λc selected by the optical filter. In addition, an arrayed waveguide grating (AWG) filter can be used to simultaneously obtain single-mode lights of a plurality of wavelengths.

The conventional single-mode light sources, however, have the following problems: since the optical filter filters a white-light occurring in a wide wavelength domain, the output of the resulting single-mode light is very small. Furthermore, the minimum value of the wavelength spectral bandwidth of the single-mode light obtained and the extinction ratio of lights generated in the overall wavelength spectrum except for its portion corresponding to a center transmission wavelength are limited by the performance of the optical filter used. In addition, since an emission phenomenon in the wavelength domain of a light transmitted through the optical filter is a probabilistic event in terms of the emission in the overall wavelength spectrum, the single-mode light obtained has intensity noise that is likely to increase with decreasing transmission wavelength spectral bandwidth of the optical filter.

That is, the wide-band white-light source 81 of the conventional single-mode light source is comprised of a SLD or an ermium-doped optical fiber amplifier (EDFA) which provides high outputs. If, however, a white-light from such a light source is spectrum-sliced, the output of the resulting single-mode light is very small. If, for example, a white-light uniformly output at 10 mW over a 100-nm band is spectrum-sliced at a bandwidth of 0.1 nm, the output of the resulting single-mode light is 10 $\mu$W at most.

Thus, an attempt is made to amplify such a faint single-mode light using an optical amplifier, but simple amplification does not induce a sufficient emission and a spontaneous emission amplified by the optical amplifier occurs in a band around the single-mode light, thereby significantly degrading the spectral purity of the single-mode light. Such degradation causes the signal-to-noise ratio in both optical communication and measurements systems.

For the optical communications systems based on the WDM technique of multiplexing signals into different wavelengths in the wavelength domain, a light source has been desired to have a low intensity noise and a high spectral purity sufficient to restrain wavelength components other than those of the signal light, in order to prevent the signal-to-noise ratio from being degraded In addition, the conventional single-mode light source for spectrum-slicing a white-light slices a narrow-band single-mode light from a wide-band light source, so that it has an inherent intensity noise within a short observation period as shown below.

If arbitrary beams are observed over a definite period of time (T), the probability $P_T(m)$ of finding (m) photons in this period is expressed by the following equation:

$$P(m)=\int_0^\infty p(m,v)W(v)dv \quad (1)$$

where p(m, v) denotes a probability density function for the probability of finding (m) photons in an independent population having an average photon flow rate (v) and W(v) denotes a probability density function for the average photon flow rate (v). The population means photons that belong to an identical emission phenomenon in a ring. Counting statistics for such a population conforms to the Poisson distribution, so that the following equation is established.

$$p(m,v)=(v^m/m!)\exp(-v) \quad (2)$$

A chaotic light source such as a wide-band light source is a class of such identical populations each of which meets the poisson distribution in equation (2). However, in photon counting statistics limiting the wavelength band, the probability density function W(v) for the average photo flow rate (v) of all populations attenuates as shown by the following expression:

$$W(v)=(1/\mu)\exp(-v/\mu) \quad (3)$$

where ($\mu$) designates the average of the average photon flow rates of different populations. Thus, the photon counting statistics in short observation period for beams obtained by spectrum-slicing the white-light is expressed as follows:

$$P(m) = \int_0^\infty \frac{v^m}{m!}\exp(-v)\frac{1}{\mu}\exp\left(-\frac{v}{\mu}\right)dv \quad (4)$$
$$= \frac{\mu^m}{(1+\mu)^{1+m}}$$

On the other hand, in a long observation period, counting photons for all spectra results in a fixed average at any point of time because all populations are subjected to counting. Consequently, the probability density function is a delta function $\delta(v-\mu)$ even for the chaotic light and conforms to the poisson distribution.

The photon counting statistics shown by Equation (4) indicates that the photon flow rate substantially fluctuates among the short observation periods, that is, indicates the presence of intensity noise. Thus, since the current optical communication systems using the method for directly modulating and detecting optical signals identify data based on the amount of photons counted in terms of time slots corresponding to bits, it cannot accommodate a large intensity noise such as one shown by Equation (4).

SUMMARY OF THE INVENTION

The present invention has been provided in view of these problems, and it is an object thereof to provide a light generation method and a light source that are preferable in obtaining a single-mode light having a high output, a small wavelength spectral bandwidth, and a low intensity noise.

It is another object of the present invention to provide a stabilized single-mode light source that can generate an incoherent single-mode light at an arbitrary wavelength which has a small spectral bandwidth and a restrained intensity noise.

It is yet another object of the present invention to provide a light generation method and a light source that are preferable in obtaining a high-output single-mode light without degrading the spectral purity of the single-mode light.

To attain these objects, the present invention carries out, at least once, the process of using an optical amplifier to amplify a single-mode light obtained by filtering a white-light by means of an optical filter, and then filtering an amplified light using an optical filter that has a center transmission wavelength equal to that of the above optical filter, so that the light intensity is increased by passage through the optical amplifier a large number of times, while the wavelength spectral bandwidth is reduced by passage through the optical filter a large number of times for filtering.

With this configuration, if a transmission wavelength characteristic of an optical filter is defined by T($\lambda$), a wavelength spectrum $\rho(\lambda)$ of a single-mode light passing through a large number of optical filters having an equal center transmission wavelength is expressed as follows:

$$\rho(\lambda)=T(\lambda)\cdot T(\lambda)\cdot \ldots \cdot T(\lambda)\cdot T(\lambda) \ldots \quad (5)$$

Thus, a single-mode light can be obtained that has a much smaller wavelength spectral bandwidth than a light obtained after a single passage through the optical filter.

Furthermore, a light generation method according to the present invention uses a simple configuration consisting of a set of optical amplifiers and filters to increase outputs while reducing the wavelength spectral bandwidth by allowing a single-mode light obtained by filtering a white-light to propagate through a path having the optical amplifiers and filters alternatively connected together. The optical amplifier also works as a white-light source covering a wide-band.

The optical amplifier can be used as a wide-band white-light source because an optical gain medium of the optical amplifier enters an inverse distribution state to obtain a gain required for optical amplification, whereby a spontaneous emission, which is low when excited, is amplified during propagation through the optical amplifier before output. Such a light is referred to as an "amplified spontaneous emission (ASE)" and characterized by its wide-band unique to the optical amplifier and its outputs higher than those of light emitting diodes.

To implement this method, the present invention constructs an optical ring by allowing an output from the optical amplifier to enter the optical filter, where it is filtered and transmitted, and by branching a light obtained and finally feeding one of the split lights back to the optical amplifier. An isolator or the like is inserted into the optical ring constructed, so that the effect set forth in Claim 1 can be obtained because the light undergoes the effects of optical amplification and filtering a large number of times while circulating through the optical ring in one direction. Since, however, a light output is obtained from a branching device provided in the optical ring, a wavelength spectrum $\rho(\lambda)$ of a single-mode light obtained shows a reduced width compared to Equation (5). That is, if the transmission wavelength characteristic T($\lambda$) of the optical filter is used and an intensity change rate per circulation through the optical ring is defined as ($\gamma$):

$$\rho(\lambda) = T(\lambda) + \gamma T(\lambda)^2 + \gamma^2 T(\lambda)^3 + \ldots = \frac{T(\lambda)}{1-\gamma T(\lambda)} \quad (6)$$

then the wavelength spectral bandwidth is substantially affected by the intensity change rate ($\gamma$). In general, when the intensity change rate is close to 1 where divergence occurs, Equation 6 provides, at the center transmission wavelength (the wavelength at T=1), a wavelength spectral bandwidth gradually approaching zero. Specifically, if T($\lambda$) is a Lorentzian transmission function and a full width at half maximum (FWHM) is 0.1 nm, the line width of an output light is 0.01 nm at $\gamma$=−0.05 dB. This is a sufficient reduction in wavelength spectral bandwidth because typical optical filters such as grating filters or dielectric multilayer film filters have an FWHM of 0.1 nm or less.

When the gain per circulation becomes excessive, the optical ring exceeds its oscillation threshold to start laser oscillation due to its configuration similar to that of a ring laser oscillator. Such laser oscillation, however, has a problem that it is so sensitive to fluctuations in optical-ring length at a wavelength level as to generate a large intensity noise when the oscillation state rapidly changes to a non-oscillation state. Thus, the present invention controls the circulation gain of the optical ring to prevent such laser oscillation. Specific means for controlling the circulation gain include, for example, means based on gain control of optical amplification used for the optical ring and means based on adjustments of attenuation provided by a variable optical attenuator inserted into the optical ring.

Furthermore, the present invention employs an optical amplifier having gain saturation to achieve a reduction in light intensity noise, which is the second object of the prior art.

Intensity noise in a single-mode light obtained by filtering a white-light using an optical filter is essentially a quantum optical element associated with an emission process. That is, the light intensity is equivalent to the number of photons counted per unit time, and a probability $P_T(m)$ of detecting (m) photons if a light is observed over a finite period of time (T) can be written as follows:

$$P_T(m) = \int_0^\infty p(m,v)W(v)dv \qquad (7)$$

where p(m,v) denotes a probability of detecting (m) photons in an independent population having an average photon flow rate (v) and W(v) denotes a probability distribution function for the average photon flow rate (v) of all populations. The population refers to a minimum unit for an independent group of emission events that are correlated to one another. In such a population, photon counting statistics for the probability p(m,v) of detecting (m) photons follows the poisson distribution, so that the following equation is established:

$$P(m, v) = \frac{v^m}{m!}\exp(-v) \qquad (8)$$

For a single-mode light obtained by filtering a white-light using an optical filter, events randomly occur in which a light is emitted within the transmission wavelength band of an optical filter, whereby an average distribution of chaotic populations is given for the chaotic light as follows:

$$W(v) = \frac{1}{\mu}\exp\left(-\frac{v}{\mu}\right) \qquad (9)$$

where $\mu$ is the average of the average photon flow rates of the different populations. Thus, the probability $P_T(m)$ of detecting (m) photons during observations over the definite period of time (T) is expressed as follows:

$$P_T(m) = \int_0^\infty \frac{v^m}{m!}\exp(-v)\frac{1}{\mu}\exp\left[-\frac{v}{\mu}\right]dv \qquad (10)$$

$$= \frac{\mu^m}{(1+\mu)^{1+m}}$$

Consequently, the probability $P_T(m)$ behaves similarly to a chaos light. The chaotic light refers to a light such as a blackbody radiation. Although the results of measurements based on temporal averaging for the wavelength domain indicate that such a single-mode light shows a stable intensity distribution based on the ergodic theorem, the light shows intensity noise in a time domain. The ergodic theorem refers to a case in which the average of the populations equals the temporal average.

Such fluctuations in the number of photons (that is, intensity noise) can be reduced using the gain saturation of optical amplifiers. The previous paper "Amplitude squeezing in a semiconductor laser using quantum nondemolition measurement and negative feedback," Y. Yamamoto, N. Imoto, and S. Machida, Phys. Rev. A, Vol.33(5), pp. 3243–3261 (1986) clarifies that fluctuations in the number of photons in a single-mode laser light similar to a coherent light can be reduced using the gain saturation of optical amplifies. This technique, however, squeezes quantum fluctuations in a laser light based on the ability to reduce quantum fluctuation for one of the two conjugate physical opinions according to the minimum uncertainty relation, at the sacrifice of increase in the other quantum fluctuation, and no attempt is made to apply this technique to the spectrum slices having a large intensity noise. As shown in FIG. 20, however, an optical-limiter effect of restraining an excess light intensity using the gain saturation of optical amplifies is effective in reducing intensity noise.

That is, a stabilized single-mode light source according to the present invention has an optical amplifying medium with gain saturation introduced into the optical ring to restrain laser oscillation. The gain saturation determines a fixed light output (a saturation output) independently of an input light intensity (a), as shown in FIG. 20. Thus, by appropriately optimizing the saturation output, the upper limit ($m_{sat}$) of the photon flow rate (m) can be reduced below a laser oscillation threshold $m_{th}$ for an individual population to hinder laser oscillation.

Consequently, if the above optical amplifier has gain saturation, intensity noise is substantially restrained because a light passes through the optical amplifier with gain saturation a large number of times according to the configuration of the present invention.

Furthermore, the light generation method according to the present invention includes optical filter control means for controlling the center transmission wavelength of the optical filter, the optical filter control means having a data-storage device for storing data of center transmission wavelengths versus control parameters of optical filters for determining the center transmission wavelength of the optical filter, the optical filter control means operative when a center transmission wavelength is provided as an instructive value, for reading from the data-storage device, the data of center transmission wavelengths versus control parameters of optical filters and controlling the optical filter so that the center transmission wavelength of the optical filter equals the center transmission wavelength provided as the instructive value.

With this configuration, if the optical filter is used for filtering and when a center transmission wavelength is provided as an instructive value, the optical-filter control means reads the data of center transmission wavelengths versus control parameters of optical filters from the data-storage device controls the optical filter based on the read data so that the center transmission wavelength of the optical filter be equal to the center transmission wavelength provided as the instructive value. As a result, a single-mode light which has a center transmission wavelength equal to the center transmission wavelength provided as the instruction value can be obtained.

Furthermore the light source according to the present invention uses a semiconductor optical amplifier as the optical amplifier having gain saturation.

The semiconductor optical amplifier, as used herein, is structured to have a double heterojunction that can realize an inverse distribution upon a current injection as in semiconductor lasers and to have an optical waveguide formed therein. The semiconductor optical amplifier is also structured to preclude end-surface reflection in order to prevent laser oscillation, so that a light is input from one end surface and output from the other end surface after being amplified while propagating through the optical waveguide. In such a semiconductor optical amplifier, the density of carriers contributing to the inverse distribution varies at a high speed depending on the input light intensity. As a result, such a semiconductor optical amplifier reacts even to components with fast variations in input light intensity and amplifies them.

Another feature of the semiconductor optical amplifier having the above characteristic is that due to a limit on the capacity with which injected electrons are stored as carriers contributing to the inverse distribution, a large optical input cannot be subjected to optical amplification based on a sufficient induced emission, resulting in a large gain saturation.

The use of the semiconductor optical amplifier having these characteristics enables light intensity noise to be substantially restrained. Furthermore, noise can be restrained in high frequency bands. Thus, a single-mode light with low noise can be obtained in a frequency band to which the field of the optical communications systems or the like is directed (<40 GHz).

In addition, the light source according to the present invention controls polarization of a light input to the semiconductor optical amplifier.

Due to its structure similar to that of a semiconductor laser, the semiconductor optical amplifier has a minor polarization-dependent gain characteristic. For a linearly polarized light, such a semiconductor optical amplifier shows a gain characteristic dependent on a polarization direction. Thus, if the polarization direction of an input light does not align with that of the semiconductor optical amplifier, the nominal gain decreases. With a configuration using the above semiconductor optical amplifier, a light passing through the semiconductor optical amplifier is output as one similar to a linearly polarized light despite a depolarized state of the input light, whereby such polarization affects reducing the net gain.

The above configuration capable of controlling polarization, however, can compensate for the polarization dependency to allow the semiconductor optical amplifier to provide a high gain, thereby improving the effect of gain saturation and increasing outputs to provide a stable and high-output single-mode light.

Furthermore, the light source according to the present invention has another optical amplifier placed in a transmission section of the above optical filter in order to improve the light intensity, which is limited by the gain saturation of the semiconductor amplifier. The another optical amplifier may be comprised of a rare-earth-element-doped optical-fiber amplifier or a semiconductor optical amplifier.

Such a configuration enables a high-output single-mode light despite the use of a semiconductor optical amplifier that obtains a large gain saturation at the sacrifice of an absolute gain.

Furthermore, according to the light source of the present invention, the optical filter comprises a disc-shaped planar substrate and filters parallel lights passing through the disc perpendicularly or almost perpendicularly to its surface in such a manner that the center transmission wavelength is varied using as a variable a viewing-angle around a rotation symmetry axis of the disc. Means for determining the viewing-angle comprises a viewing-angle detection means consisting of detection of a mark written on the disc. Using a data-storage device for storing data on the center transmission wavelength using as variables the viewing-angle and a temperature measured near the optical filter, the viewing-angle of the optical filter is controlled so that the center transmission wavelength of the optical filter equals a center transmission wavelength provided as the instructive value. At the same time, the temperature measured near the optical filter is detected to constantly fine-tune the viewing-angle of the optical filter so that the center transmission wavelength of the optical filter equals the instructive value. The wavelength characteristic that the center transmission wavelength varies using the viewing-angle around the rotation symmetry axis of the disc is provided by a dielectric multilayer film band transmission optical filter having a cavity layer thickness proportional or almost proportional to the viewing-angle.

With such a configuration, by calibrating a center transmission wavelength of a disc-shaped dielectric-multilayer-film optical filter used as the optical filter, a single-mode light with a center transmission wavelength equal to the indicated wavelength can be obtained despite the simple configuration and without adverse effects of an environment temperature used for the light source.

Furthermore, the light source according to the present invention uses an ultrasonic motor as means for varying the viewing-angle of the disc-shaped optical filter.

The ultrasonic motor generates a transverse wave (a wave vibrating in a direction perpendicular to a propagating direction) on a surface to carry an object in contact with the surface on a wave front of the traveling wave based on frictional force. Such a motor is characterized by its small size, high drive force, and ability to hold an object at the same position by friction force.

This configuration does not only enable the above disc-shaped optical filter and its control system to be compactly assembled but also maintains optimal conditions under sequential control, by reading from the data-storage device, transmission wavelength data comprising the viewing-angle of the disc-shaped optical filter stored in the data-storage device so that the center transmission wavelength of the optical filter equals a center transmission wavelength provided as the instructive value, and by setting the center transmission wavelength at an optimal value, although temperature varies. In addition, if the temperature varies, then it is monitored and based on the read transmission wavelength data comprising the viewing-angle of the disc-shaped optical filter, the viewing-angle of the optical filter can be corrected to obtain a center transmission wavelength equal to the instructive value. This configuration stably provides a single-mode light having a center transmission wavelength equal to the indicated wavelength.

Furthermore, according to the light source of the present invention, the optical filter comprises an acoustooptical filter for controlling the center transmission wavelength depending on the frequency of an electrical oscillator; the light source has a data-storage device for storing a center transmission wavelength obtained using the frequency as a variable, as data of center transmission wavelengths versus control parameters of optical filters; and when a center transmission wavelength is provided as an instructive value, the data is read from the data-storage device and the frequency of the electrical oscillator for controlling the optical filter is controlled so that the center transmission wavelength of the optical filter equals the instructive value.

This configuration enables the center transmission wavelength of the optical filter to be switched at a high speed within a range of speeds at which the frequency of the electrical oscillator is controlled, thereby allowing the center transmission wavelength of a single-mode light to be promptly set at this speed depending on a timing with which the instructive value is received.

In addition, according to a stabilized single-mode light source, one or more optical amplifying media, an optical filter, an optical power divider, and an optical attenuator is connected together in the form of a ring to form an optical ring; at least one of the optical amplifying media has gain saturation; and attenuation provided by the optical attenuator is adjusted so that a mode circulating through the optical ring is kept equal to or smaller than a laser oscillation threshold, so that a monochromatic light of a wavelength selected by the optical filter is branched and output from the optical power divider.

That is, a light output from the optical amplifying medium is spectrum-sliced by the optical filter, then the optical ring is formed in which an input is led to the optical gain medium via the optical attenuator, and finally the excitation level of the optical gain medium and attenuation provided by the optical attenuator are adjusted to allow the light to circulate through the ring a number of times while being attenuated.

When the optical filter is inserted into the optical ring including the optical amplifying medium, bands in which spontaneous emission occurs are limited to within the band of the optical filter. Thus, all populations are subjected to photon counting even during a short observation time. Consequently, the average of the average photon flow rates of the populations is fixed regardless of the observation time. The probability density function $W(v)$ approaches a delta function, and even for a spectrum slice circulating through the optical ring while being attenuated, the probability density function $P_T(m)$ for the photon counting statistics shows the poisson distribution, as shown in FIG. 7B.

If the gain of the optical amplifying medium is not saturated, the probability density function converges on zero but does not reach exact zero despite an infinite value of the photon flow rate (m). Thus, there is a probability that a photon flow rate equal to or larger than an oscillation threshold of the optical ring occurs and that the rate meets a wavelength required for resonance with the optical ring as well as polarization conditions to lead to laser oscillation, as shown in FIG. 7A. Since in a laser oscillation state, the average photon flow rate is fixed independently of the population, the photon counting statistics for all populations shows the poisson distribution, as shown in FIG. 7B. When an oscillation mode grows from a population, the extension of the probability density function for the photon counting statistics for all populations is smaller than that for a noise wave.

Such a laser oscillation state, however, is difficult to sustain for a long time due to fluctuations in the optical ring (for example, fluctuations in fiber length). Thus, the oscillation state rapidly changes to a non-oscillation state to cause a large intensity noise. In the non-oscillation state, the individual populations compete again, and one dominant population enters the laser oscillation state to generate a similar intensity noise. Such intensity noise caused by laser oscillation substantially obstructs optical communication systems.

A light circulating through the optical ring while being attenuated has its band with reduced due to passage through the optical filter a number of times. When the filter transmission function is defined as $T(\lambda)$ and a net loss per circulation is defined as $(\gamma)$, a full transmission function $T_{eff}(\lambda)$ is expressed as follows:

$$T_{eff}(\lambda)=T+\gamma T^2+\gamma^2 T^3+ \ldots =T/(1-\gamma T) \tag{11}$$

If T is a Lorentz transmission function and the full width at half maximum is 0.1 nm, the spectrum width of an output light is 0.01 nm at $\gamma=-0.05$ dB. Even for such a spectrum slice of a reduced width, the photon counting statistics follows the poisson distribution.

In addition, the light generation method according to the present invention outputs a single-mode light by filtering a spontaneous emission using an optical filter, and comprises using an optical amplifier as a light source for generating the spontaneous emission, inputting to the optical amplifier a spontaneous emission having a larger bandwidth than the transmission bandwidth of the optical filter and including the center transmission wavelength of the optical filter in this band in order to increase, in the optical amplifier, the probability density of light emission of the single-mode light near the center transmission wavelength, and using the optical filter to filter the spontaneous emission amplified by the optical amplifier. The "single-mode light" refers to a light showing a unimodal shape in the wavelength domain (a light having significantly high wavelength components only in a particular band).

Furthermore, the light generation method according to the present invention outputs a single-mode light having wavelength components in a particular band of the spontaneous emission band by obtaining the single-mode light from a spontaneous emission having wavelength components over a wide band in a wavelength domain, and the single-mode light is obtained by carrying out, at least once, the process of filtering the spontaneous emission using an optical filter having at least the transmission bandwidth of the particular band, using an optical amplifier to amplify a light transmitted through the optical filter, and filtering the light using the optical filter having at least the transmission bandwidth the particular band.

According to this method, the spontaneous emission is first filtered by the optical filter. The light transmitted through the optical filter has the wavelength components in the particular band because the other components in the spontaneous emission band are filtered. Then, the light transmitted through the optical filter is amplified by the optical amplifier and filtered by the optical filter. After this amplification, the light transmitted through the optical filter contains the spontaneous emission amplified by the optical amplifier, but this spontaneous emission is filtered by the subsequent optical filter, resulting in the wavelength components in the particular band being particularly amplified. The single-mode light is obtained by carrying out a process comprising such amplification and filtering at least once.

The process of using the optical amplifier to amplify the light transmitted through the optical filter and filtering the light using the optical filter having at least the transmission bandwidth of the particular band may be carried out at least once but may be executed a number of times as required.

In addition, the optical filter for filtering the spontaneous emission may be identical to or different from the optical filter for filtering the light amplified by the amplifier.

Furthermore, the light generation method according to the present invention comprises the steps of filtering the spontaneous emission using a first optical filter having at least the transmission bandwidth of the particular band, using the optical amplifier to amplify a light transmitted through the first optical filter, and filtering the amplified light from the optical amplifier using a second optical filter having at least the transmission bandwidth the particular band, in order to obtain a light transmitted through the second optical filter as the single-mode light.

The first and second optical filters may be configured to have identical characteristics or to have different characteristics if they have at least the transmission bandwidth of the particular band. Since the profile of the single-mode light is determined by a transmission profile of the second optical filter, the center transmission wavelengths of these optical filters need not be exactly equal. For example, the first optical filter may have the transmission bandwidth of a wider band including the particular band, while the second optical filter may have the transmission bandwidth only of the particular band.

Furthermore, according to the light generation method of the present invention, the second optical filter has a center transmission wavelength identical to the center transmission wavelength of the transmission band of the first optical filter and has a transmission bandwidth smaller than or identical to the transmission bandwidth of the first optical filter.

In addition, the light generation method according to the present invention comprises the steps of filtering the spontaneous emission using an optical filter having at least the transmission bandwidth of the particular band, using the optical amplifier to amplify a light transmitted through the optical filter and feeding the light back to the optical filter to obtain a light transmitted through the optical filter as the single-mode light.

Furthermore, according to the light generation method of the present invention, the filtering is carried out when a center transmission wavelength is provided as an instructive value, by reading data of center transmission wavelengths versus control parameters of optical filters, from a data-storage device with this data stored therein and controlling the optical filter based on the read data so that the center transmission wavelength of the transmission band of the optical filter equals the center transmission wavelength provided as the instructive value.

In addition, according to the light generation method of the present invention, the optical filter is a disc-shaped optical filter having a predetermined transmission bandwidth and a circularly changed central transmission wavelength, and carries out filtering by changing the center transmission wavelength depending on a rotation angle of the disc-shaped filter in such a manner that light is incident on a surface of the disc-shaped filter at a fixed position thereof to pass through in a rotation axis direction, wherein the filtering is carried out when a center transmission wavelength is provided as an instructive value, by reading data of center transmission wavelengths versus control parameters of optical filters, from a data-storage device with this data stored therein, the data comprising different center transmission wavelengths of the optical filter associated with corresponding rotation speeds of the disc-shaped filter, and controlling the viewing-angle of the disc-shaped filter of the optical filter based on the read data so that the center transmission wavelength of the transmission band of the optical filter equals the center transmission wavelength provided as the instructive value.

On the other hand, the light source of the present invention outputs a single-mode light by filtering a spontaneous emission using an optical filter, and includes an optical amplifier for generating the spontaneous emission. The light source inputs to the optical amplifier a spontaneous emission having a bandwidth larger than the transmission bandwidth of the optical filter and including the center transmission wavelength of the optical filter in this band in order to increase, in the optical amplifier, the probability density of light emission of the single-mode light near the center transmission wavelength, and uses the optical filter to filter the spontaneous emission amplified by the optical amplifier.

With this configuration, the spontaneous emission having a bandwidth larger than the transmission bandwidth of the optical filter and including the center transmission wavelength of the optical filter in this band is input to the optical amplifier, thereby increasing, in the optical amplifier, the probability density of light emission of the single-mode light near the center transmission wavelength. Then, the spontaneous emission amplified by the optical amplifier is filtered by the optical filter.

Furthermore, the light source of the present invention outputs a single-mode light having wavelength components in a particular band of a spontaneous emission band by obtaining the single-mode light from a spontaneous emission having wavelength components over a wide band in a wavelength domain. In this case, the single-mode light is obtained by carrying out, at least once, the process of filtering the spontaneous emission using an optical filter having at least the transmission bandwidth of the particular band, using an optical amplifier to amplify a light transmitted through the optical filter, and filtering the light using the optical filter having at least the transmission bandwidth of the particular band.

With this configuration, the spontaneous emission is first filtered by the optical filter. Thus, the light transmitted through the optical filter has the wavelengths in the particular band because the other wavelength components are filtered. Then, the light transmitted through the optical filter is amplified by the optical amplifier and filtered by the optical filter. After this amplification, the light transmitted through the optical filter contains the spontaneous emission amplified by the optical amplifier, but this spontaneous emission is filtered by the subsequent optical filter, resulting in the wavelength components in the particular band being particularly amplified. The single-mode light is obtained by carrying out a process comprising such amplification and filtering at least once.

The process of using the optical amplifier to amplify the light transmitted through the optical filter and filtering the light using the optical filter having at least the transmission bandwidth of the particular band may be carried out at least once but may be executed a number of times as required.

In addition, the optical filter for filtering the spontaneous emission may be identical to or different from the optical filter for filtering the light amplified by the amplifier.

Furthermore, the light source according to the present invention comprises a first optical filter having at least the transmission bandwidth of the particular band and a second optical filter having at least the transmission bandwidth of the particular band. The light. source filters the spontaneous emission using the first optical filter, uses the optical amplifier to amplify a light transmitted through the first optical filter, and filters the amplified light from the optical amplifier using the second optical filter to obtain a light transmitted through the second optical filter as the single-mode light.

With this configuration, the spontaneous emission is filtered by the first optical filter, and the light transmitted through the first optical filter is amplified by the optical amplifier. Then the amplified light from the optical amplifier is filtered by the second optical filter to obtain the light transmitted through the second optical filter as the single-mode light.

The first and second optical filters may be configured to have identical characteristics or to have different characteristics if they have at least the transmission bandwidth of the particular band. Since the profile of the single-mode light is determined by a transmission profile of the second optical filter, the center transmission wavelengths of these optical filters need not be exactly equal. For example, the first optical filter may have the transmission bandwidth of a wider band including the particular band, while the second optical filter may have the transmission bandwidth only of the particular band. However, in order to ensure the wavelength accuracy of the single-mode light, the center transmission wavelength of the second optical filter must be precisely calibrated and temperature and atmospheric pressure must be compensated for.

Furthermore, according to the light source of the present invention, the second optical filter has a center transmission wavelength identical to the center transmission wavelength of the transmission band of the first optical filter and has a transmission bandwidth smaller than or identical to the transmission bandwidth of the first optical filter.

In addition, the light source according to the present invention comprises an optical filter and an optical filter having at least the transmission bandwidth of the particular band. The light source filters the spontaneous emission using the optical filter, uses the optical amplifier to amplify a light transmitted through the optical filter, and feeds the light back to the optical filter to obtain a light transmitted through the optical filter as the single-mode light.

With this configuration, the spontaneous emission is filtered by the optical filter, the light transmitted through the first optical filter is amplified by the optical amplifier, and. Then, the amplified light from the optical amplifier is filtered by the second optical filter to obtain the light transmitted through the second optical filter as the single-mode light.

Furthermore, the light source according to the present invention comprises optical filter control means for controlling the center transmission wavelength of the optical filter, and the optical filter control means has a data-storage device storing data of center transmission wavelengths versus control parameters of optical filters for determining the center transmission wavelength of the optical filter. When a center transmission wavelength is provided as an instructive value, the optical filter control means reads from the data-storage device the data of center transmission wavelengths versus control parameters of optical filters and controls the optical filter based on the read data so that the center transmission wavelength of the optical filter equals the center transmission wavelength provided as the instructive value.

With this configuration, if the optical filter is used for filtering and when a center transmission wavelength is provided as an instructive value, the optical-filter control means reads from the data-storage device the data of center transmission wavelengths versus control parameters of optical filters and controls the optical filter based on the read data so that the center transmission wavelength of the optical filter equals the center transmission wavelength provided as the instructive value. As a result, the light incident on the optical filter is filtered for the transmission bandwidth of the center transmission wavelength provided as the instruction value.

If a plurality of different optical filters (a first and a second optical filters) are used, these filters are preferably controlled so that their center transmission wavelengths are simultaneously changed.

Furthermore, according to the light source of the present invention, the optical filter is a disc-shaped optical filter having a predetermined transmission bandwidth and a circularly changed central transmission wavelength, and carries out filtering by varying the center transmission wavelength depending on a viewing-angle of the disc-shaped filter in such a manner that light is incident on a surface of the disc-shaped filter at a fixed position thereof to pass through a rotation axis direction. The light source comprises optical filter control means for controlling the center transmission wavelength of the optical filter, and the optical filter control means has a data-storage device for storing data of center transmission wavelengths versus control parameters of optical filters, the data comprising different center transmission wavelengths of the optical filter associated with corresponding viewing-angles of the disc-shaped filter. When a center transmission wavelength is provided as an instructive value, the optical filter control means reads from the data-storage device the data of center transmission wavelengths versus control parameters of optical filters, and controls the viewing-angle of the disc-shaped filter of the optical filter based on the read data so that the center transmission wavelength of the transmission band of the optical filter equals the center transmission wavelength provided as the instructive value.

With this configuration, if the optical filter is used for filtering and when a center transmission wavelength is provided as an instructive value, the optical-filter control means reads from the data-storage device the data of center transmission wavelengths versus control parameters of optical filters and controls the optical filter based on the read data so that the center transmission wavelength of the optical filter equals the center transmission wavelength provided as the instructive value. As a result, the light incident on the optical filter is filtered for the transmission bandwidth of the center transmission wavelength provided as the instruction value.

If a plurality of different optical filters (a first and a second optical filters) are used, these filters are preferably controlled so that their center transmission wavelengths are simultaneously changed.

The above and other objects, effects, features, and advantages of the present invention will become more apparent from the following description of embodiments thereof taken in conjunction with the accompanying drawings.

DESCRIPTION OF THE PREFERRED EMBODIMENTS

Embodiments of the present invention will be described below with reference to the drawings.

(First Embodiment)

Figure 1:
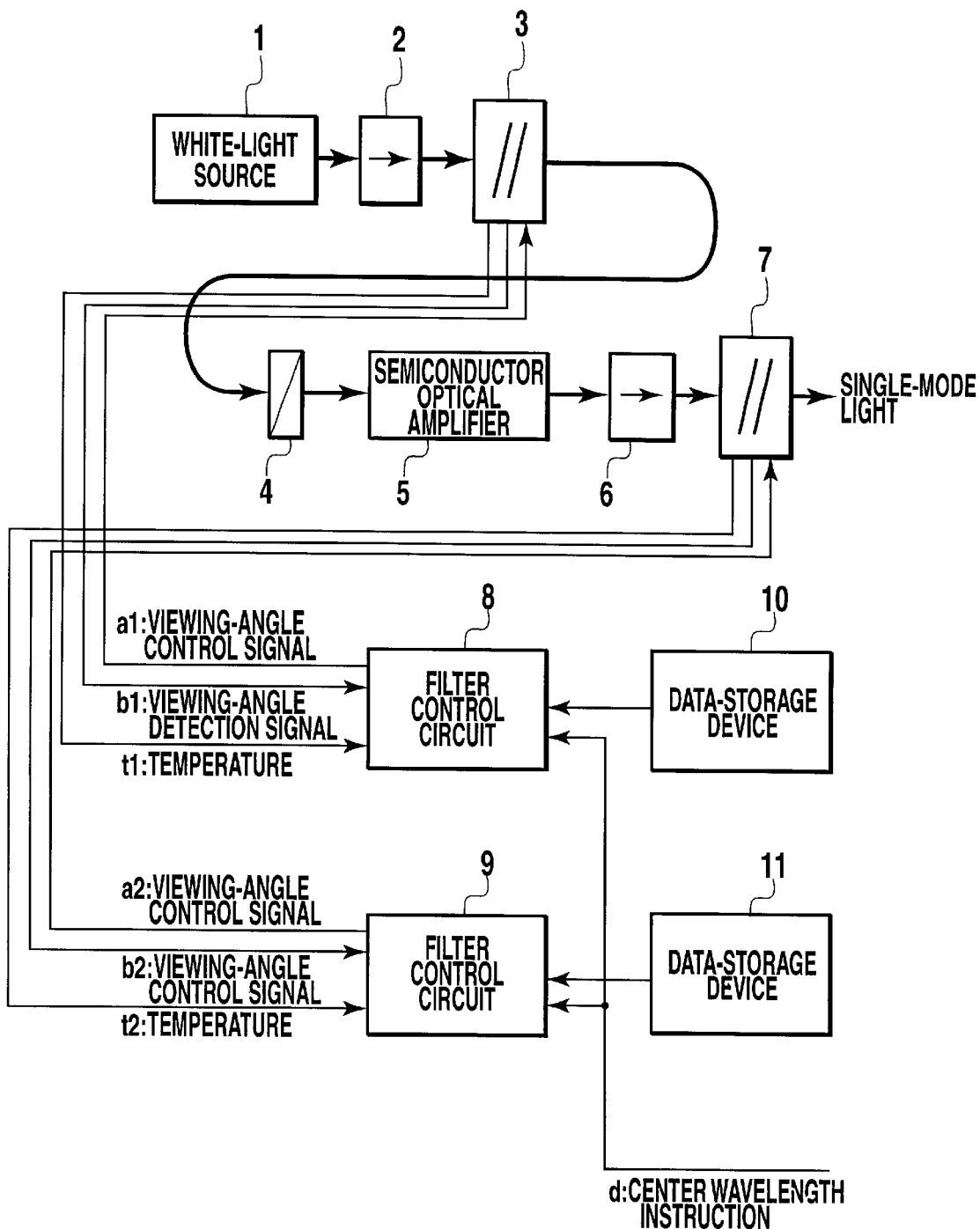
FIG. 1 shows a first embodiment of a light generation method and a light source according to the present invention.

FIG. 1 shows a first embodiment of a light generation method and a light source according to the present invention. The light generation method and light source according to the first embodiment are comprised of a white-light source 1, isolators 2 and 6, disc-shaped optical filters 3, 7, a polarization controller 4, a semiconductor optical amplifier 5, filter control circuits 8, 9, and data-storage devices 10, 11.

A white-light output from the white-light source 1 and having wavelength components over a wide band on a wavelength spectrum passes through the isolator 2 and is then filtered by the disc-shaped optical filter 3. A light transmitted through the filter 3 is input to the semiconductor optical amplifier 5 having its polarization plane controlled by the polarization controller 4. An output from the amplifier 5 is filtered by the disc-shaped optical filter 7 via the isolator 6 to generate a single-mode light having a small spectral bandwidth and high outputs. Polarization control by the polarization controller 4 corresponds to control of the polarization plane of an input light be adjustable to the semiconductor optical amplifier 5, thereby so as to obtain a maximum gain from the amplifier 5. If the white-light source 1 and the semiconductor optical amplifier 5 are independent of polarization, the polarization controller 4 may be omitted.

Upon reception of center transmission wavelength instructions (d), the disc-shaped optical filters 3 and 7 are independently controlled by the corresponding filter control circuits 8, 9 so that their center transmission wavelengths equal instructive values indicated in the center transmission wavelength instructions (d). That is, the filter control circuit 8 reads data for the disc-shaped optical filter 3 indicating center transmission wavelengths versus control parameters of optical filters, from the data-storage device 10 with this data stored therein. The circuit 8 subsequently uses a viewing-angle detection angle b1 obtained by detecting a viewing-angle of the disc of the optical filter as well as a temperature t1 to calculate a viewing-angle so that its center transmission wavelength equals the corresponding instructive value. The circuit 8 then sends a viewing-angle control signal a1 to the optical filter so as to equalize the viewing-angle with a calculated value. The disc-shaped optical filter 3 is controlled in this manner.

Likewise, the disc-shaped optical filter 7 is controlled using the filter control circuit 9 by using data from the data-storage device 11 storing data of center transmission wavelengths versus control parameters of optical filters as well as a viewing-angle detection signal b2 and a temperature t2 to calculate a target viewing-angle, and sending a viewing-angle control signal a2.

Figure 4:
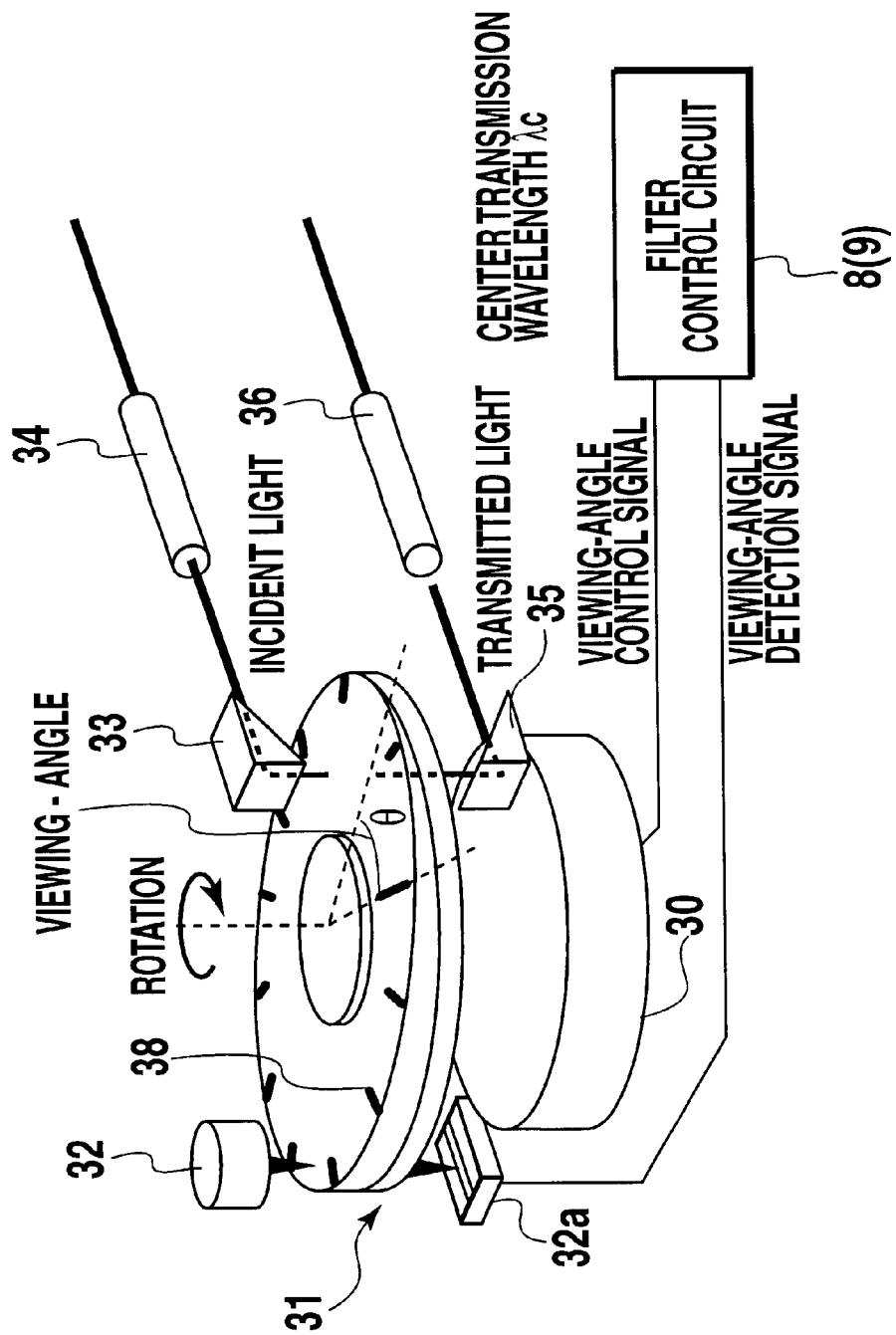
FIG. 4 shows a configuration of a disc-shaped optical filter.

FIG. 4 shows a configuration of the disc-shaped optical filter 3, 7. A disc-shaped filter 31 in a main body filters an incident light in a wavelength domain by allowing collimated beams (parallel lights) emitted from an optical fiber 34 to enter the disc perpendicularly or almost perpendicularly to a disc surface, and allowing a transmitted light to enter another optical fiber 36. The disc-shaped filter 31 has marks 38 applied to its outer periphery and which are detected to determine a position through which the collimated beams are allowed to pass. A typical example of such mark detection means is a method for using a light emitting diode (LED) as a light source and detecting, below the diode 32, a change in a light irradiated portion caused by the mark 38 to determine a viewing-angle Θ as positional information. This method is implemented by a rotary encoder 32a. The disc-shaped filter 31 has its center transmission wavelength-tunable depending on the viewing-angle Θ, so that it rotates the disc around its rotation axis to vary the viewing-angle Θ and thus the center transmission wavelength. Means for rotating the disc may be an ultrasonic motor 30 that can be formed to be very small.

Figure 5:
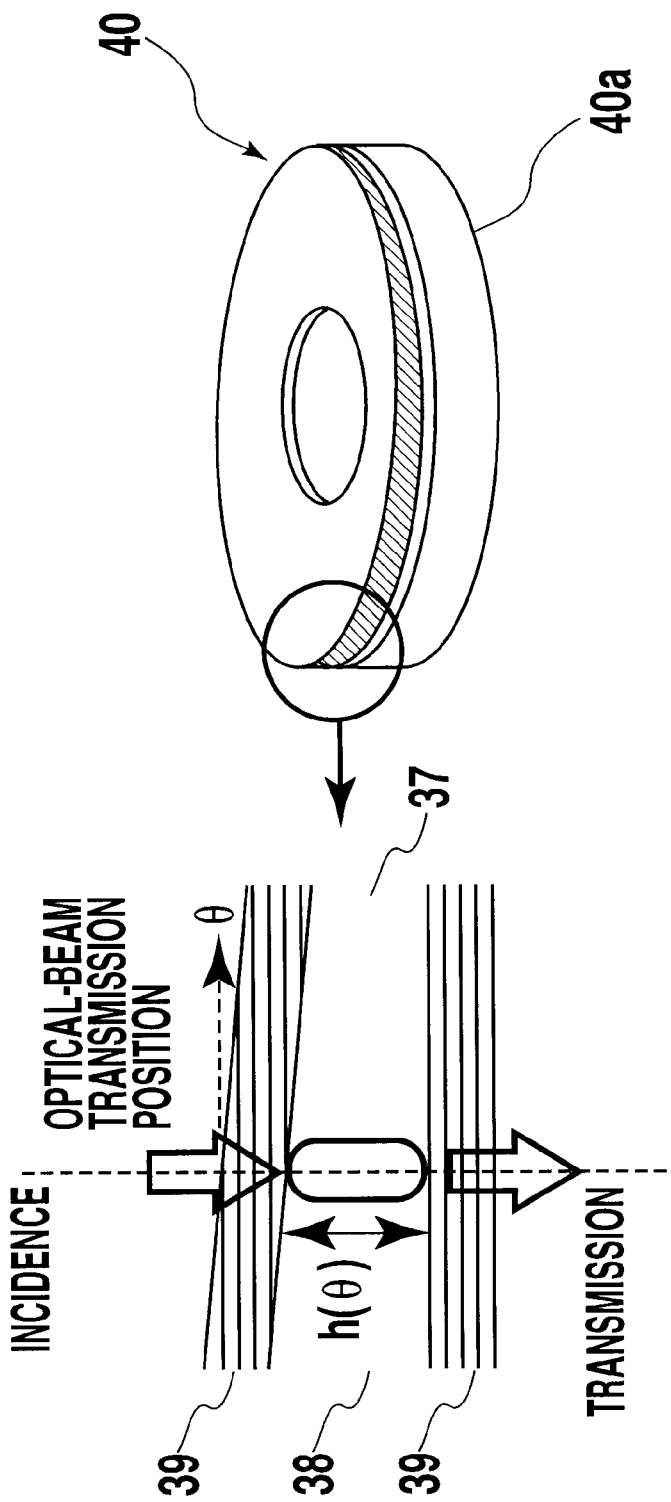
FIG. 5 shows a configuration of a disc-shaped optical filter.

FIG. 5 shows the structure of a filter section of the disc-shaped filter 31. A function for filtering wavelengths is based on a wavelength selection function of an optical resonator 37 consisting of a layer called a "wedge layer 38" that is located between high-reflectivity layers (HR). The wedge layer 38 has a thickness almost half an effective wavelength, which is determined taking into consideration a refractive index with which a light passes through a medium. The high-reflectivity layers 39 have a thickness one fourth of the effective wavelength as well as different refractive indices and are alternatively laminated. In such a film structure, the wedge layer 38 of thickness (h) is formed in a substrate of $SiO_2$ or the like linearly or almost linearly relative to the viewing-angle Θ to enable the center transmission wavelength to be filtered in proportion or almost proportion to the viewing-angle Θ. An antireflection coating 40a is applied to a rear surface of the substrate 40 to prevent undesirable reflection from the substrate.

Figure 6:
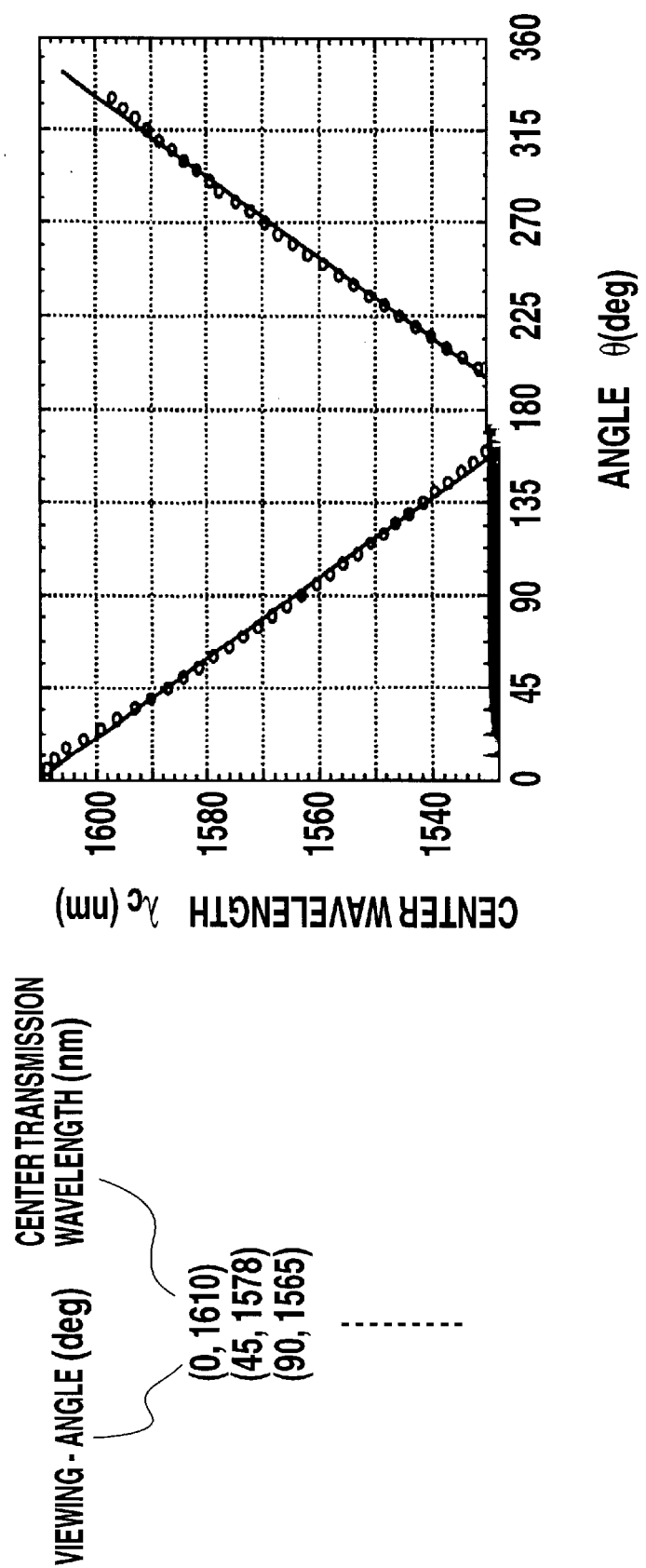
FIG. 6 shows data for the optical filter indicating center transmission wavelengths versus control parameters of optical filters.
Figures 7A, 7B:
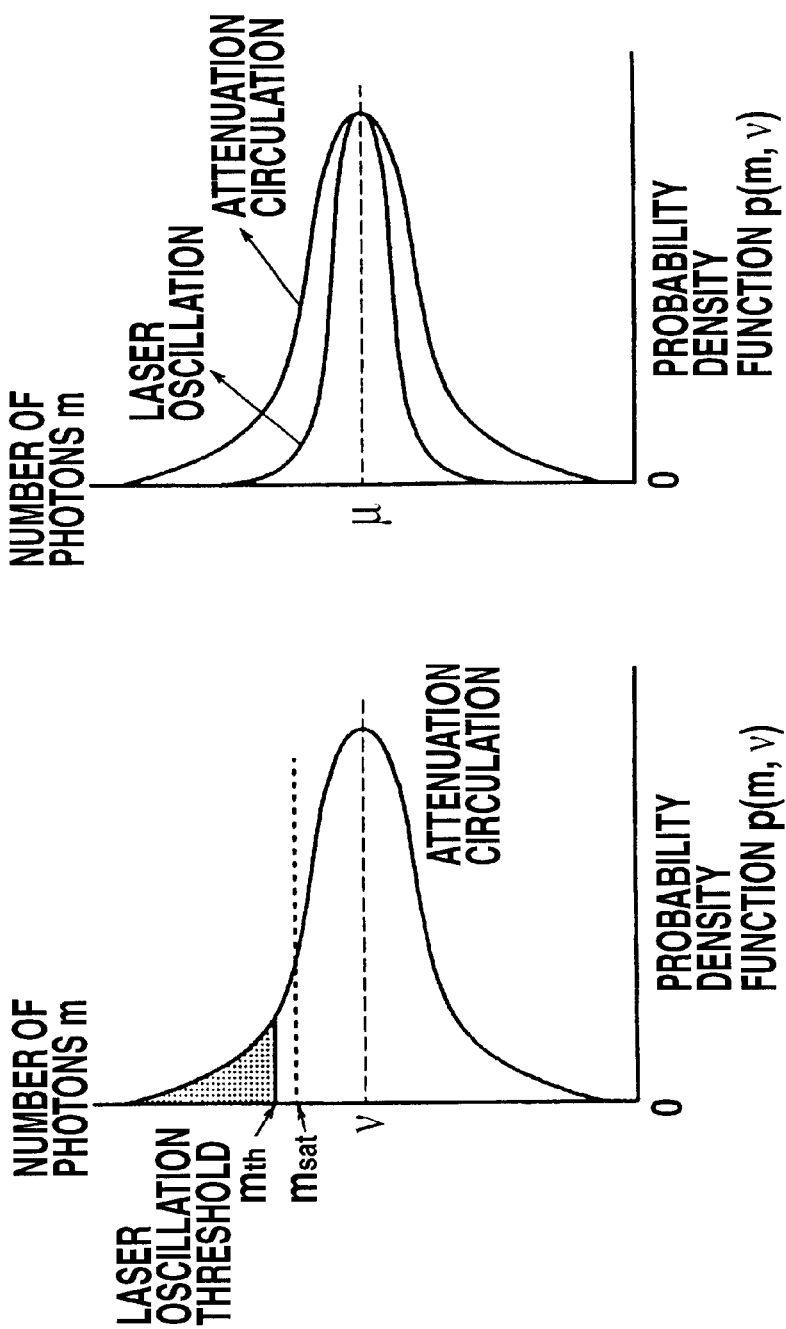
FIGS. 7A and 7B show photon counting statistics for stabilized noise waves.

With such a configuration, if the viewing-angle Θ of the disc is calibrated as a function of a center transmission wavelength using the temperature as a parameter and this data is stored in the data-storage devices 10, 11, as shown in FIG. 6, and when a center transmission wavelength is provided as an instructive value, then a temperature can be measured at a location near the installed disc-shaped filter to calculate an optimal value.

The above first embodiment allows a transmitted light obtained by filtering a white-light using the optical filter to pass through the set of the semiconductor optical amplifier 5 and the optical filter 7 in order to increase outputs while reducing the wavelength spectrum. Larger effects, however, can be obtained by allowing the light to pass through a large number of sets of the semiconductor optical amplifier and the optical filter.

(Second Embodiment)

Figure 2:
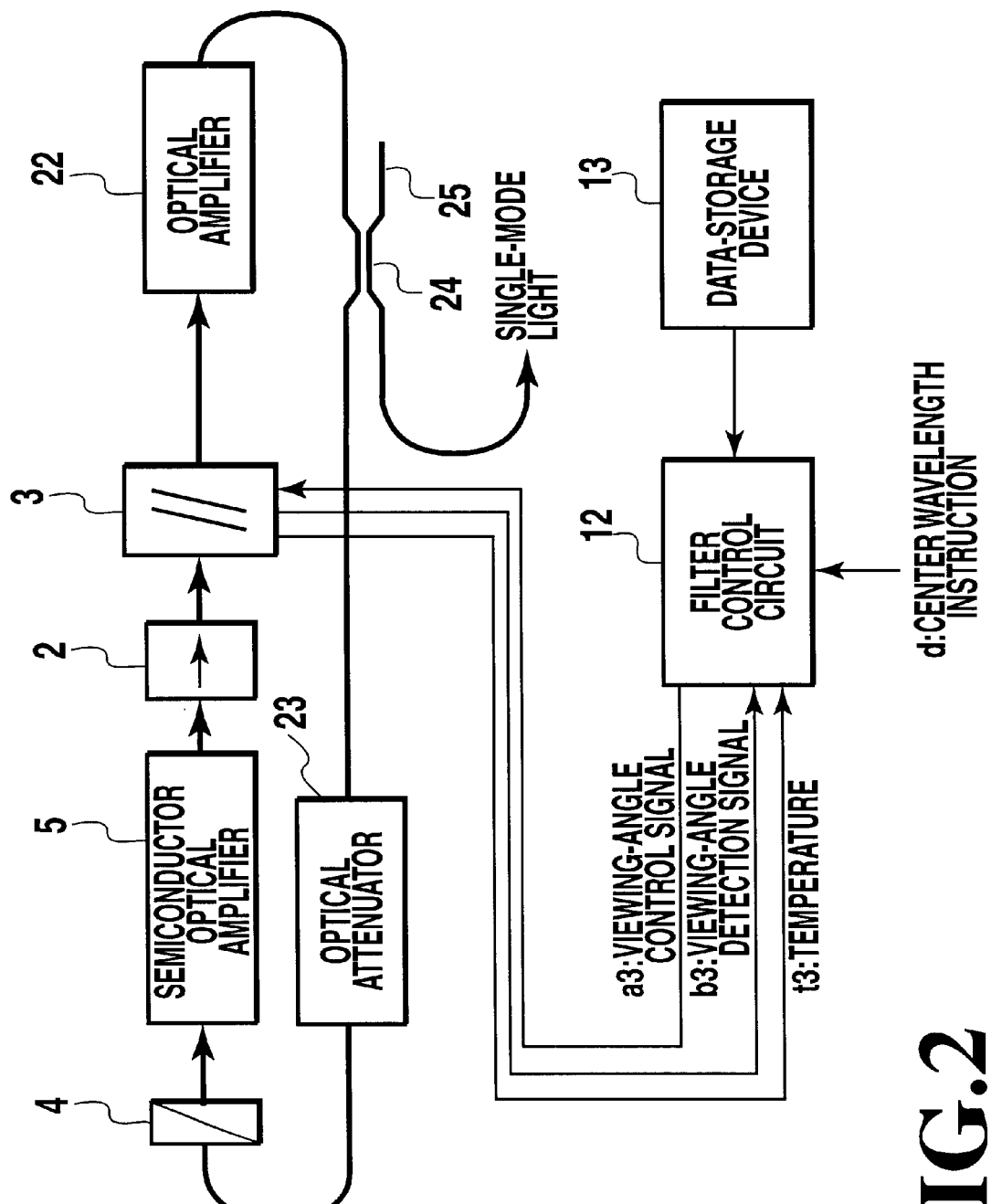
FIG. 2 shows a second embodiment of a light generation method and a light source according to the present invention.

FIG. 2 shows a second embodiment of a light generation method and a light source according to the present invention. The light generation method and light source according to the second embodiment are comprised of an optical ring consisting of a semiconductor optical amplifier 5, the isolator 2, the disc-shaped optical filter 3, an optical amplifier 22, an optical power divider 24, an optical attenuator 23, and the polarization controller 4 so that a single-mode light can be obtained from the optical power divider 24.

A single-mode light is obtained by circulating lights generated by the semiconductor optical amplifier 5 and the optical amplifier 22, through the optical ring as seeds. That is, the semiconductor optical amplifier 5 and the optical amplifier 32 have effects similar to those of the white-light source 1 in the first embodiment. The attenuator 23 controls a circulation gain so as to prevent laser oscillation in the optical ring. As regards this, if the semiconductor optical amplifier 5 has a high gain, the optical amplifier 22 may be omitted.

Upon reception of the center transmission wavelength instruction (d), the disc-shaped optical filter is controlled by reading data for the disc-shaped optical filter 3 indicating center transmission wavelengths versus control parameters of optical filters, from the data-storage device 13 with this data stored therein, and using a viewing-angle detection signal b3 and a temperature t3 to calculate an optimal viewing-angle in order to generate a viewing-angle control signal a3, as in the first embodiment.

With such a configuration, despite its simplicity, a filtered single-mode light can be efficiently amplified while reducing the wavelength spectrum, thereby obtaining a single-mode light having higher outputs and a smaller spectral bandwidth than the single-mode light in the first embodiment.

(Third Embodiment)

Figure 3:
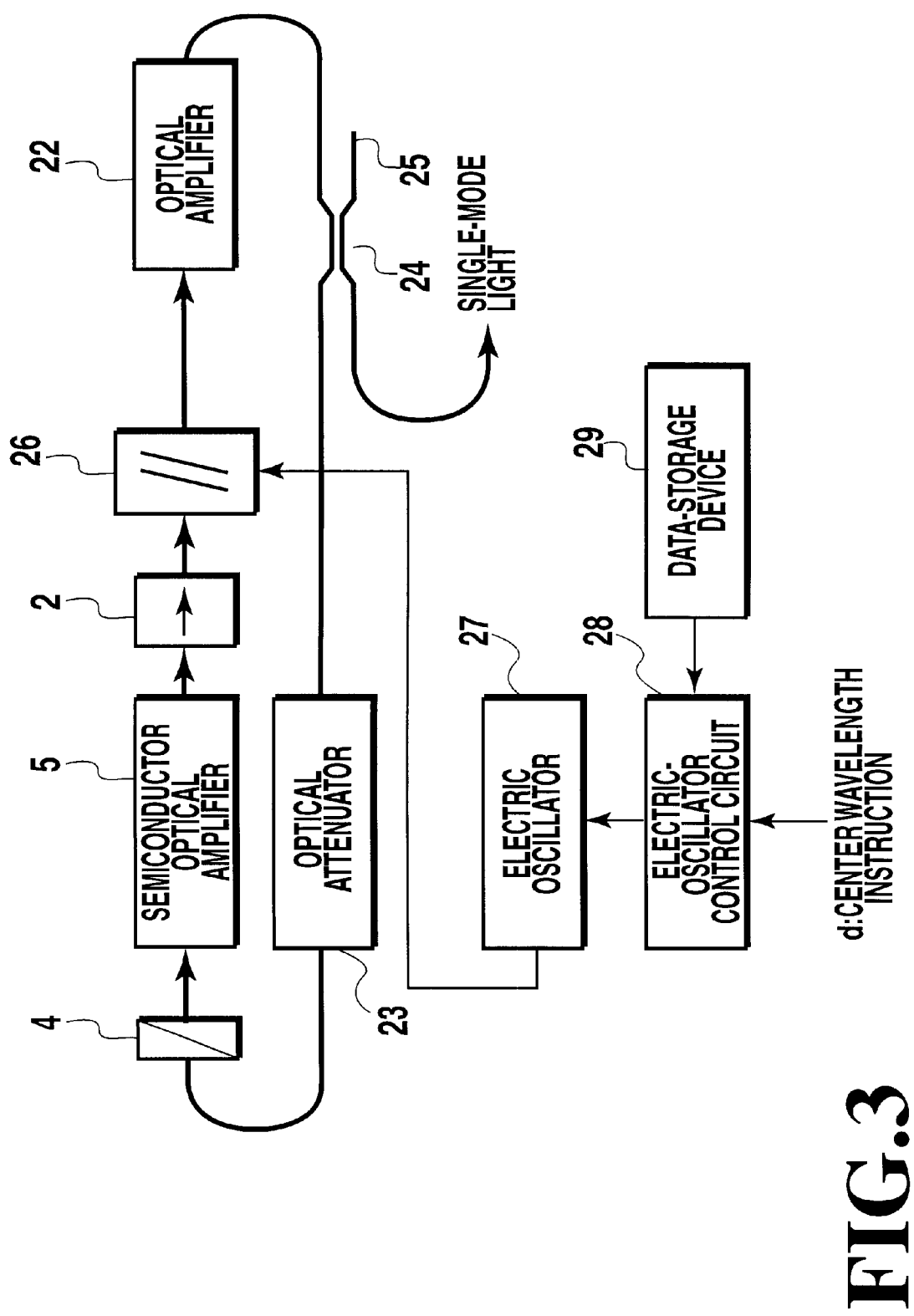
FIG. 3 shows a third embodiment of a light generation method and a light source according to the present invention.

FIG. 3 shows a third embodiment of a light generation method and a light source according to the present invention. The light generation method and light source according to the third embodiment are comprised of an optical ring consisting of the semiconductor optical amplifier 5, the isolator 2, an acoustooptical filter 23, an optical amplifier 19, the optical power divider 24, the optical attenuator 23, and the polarization controller 4 so that a single-mode light can be obtained from the optical power divider 24. Such a configuration is the same as that of the second embodiment.

The acoustooptical filter 26 is comprised of a dielectric waveguide formed using as a material an electrical engineering crystal that utilizes a phenomenon in which the refractive index varies with a voltage and of an electrode formed in the waveguide and allowing electric signals within a microwave frequency band to be superposed together. In the acoustooptical filter 26, upon external application of an AC electric signal, the refractive index is spatially modulated in such a way as to correspond to the frequency of the signal. The use of the periodicity of such a spatial modulation can be used to filter a light having a wavelength corresponding to the frequency of an electric signal.

According to the third embodiment, the relationship between the center transmission wavelength of the acoustooptical filter 26 and the frequency of electric signals is stored in the data-storage device 29 as data of center transmission wavelengths versus control parameters of optical filters. Upon reception of the center transmission wavelength instruction, this data is read, and the electrical oscillator 27 is controlled by an electrical-oscillator control circuit 28 so that the center transmission wavelength of the acoustooptical filter equals the instructive value. An electric signal output from the electrical oscillator 27 is applied to the acoustooptical filter 26 to obtain a single-mode light having a center transmission wavelength equal to the instructive value.

Since the center transmission wavelength of the acoustooptical filter 26 is promptly controlled by means of the frequency of the applied electric signal, the center transmission wavelength of the single-mode light can be switched at a much higher speed (~µs) than that in the first or second embodiment.

(Fourth Embodiment)

Figure 8:
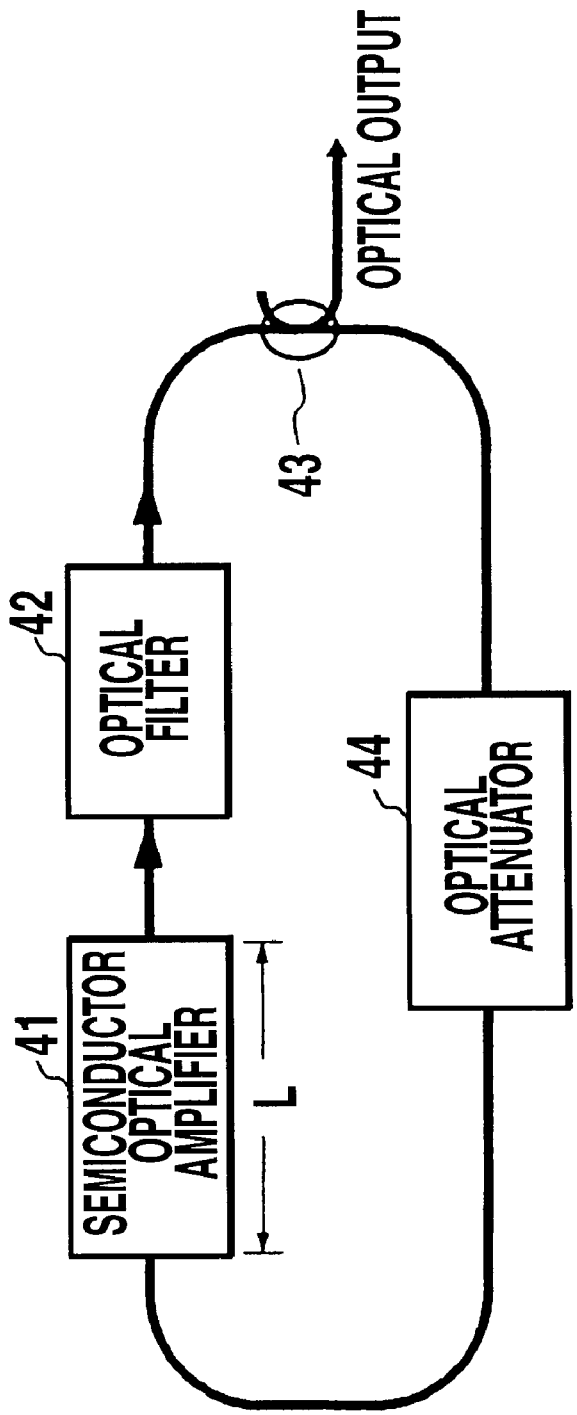
FIG. 8 shows a fourth embodiment of a stabilized single-mode light source according to the present invention.

FIG. 8 shows a fourth embodiment of a stabilized single-mode light source according to the present invention. The stabilized single-mode light source according to this embodiment is comprised of a semiconductor optical amplifier with gain saturation (reference①: Kiyoshi NAKAGAWA et al. "Optical Amplifiers and Their Applications", Ohm Co., Ltd.) 41, an optical filter 42, an optical power divider 43, and an optical attenuator 44, all of which are connected together in the form of a ring, wherein a light output (a single-mode light) is externally obtained from the optical power divider 43.

The optical attenuator 44 is comprised, for example, of a ND filter that utilizes attenuation of absorption by a metal thin film, and adjusts the attenuation so that a mode circulating through the optical ring is equal to or smaller than a laser oscillation threshold. The optical filter 42 is generally a dielectric multilayer film filter but may be comprised of a combination of a fiber grating and an optical circulator.

The semiconductor optical amplifier 41 increases light intensity in accordance with the following differential equation:

$$\frac{d}{dz}I(z) = \{g(I) - \alpha\}I(z) \tag{12}$$

where I denotes light intensity, (g) denotes a gain factor, (α) denotes a loss to a waveguide, and (z) denotes a propagation distance. On the other hand, the gain saturation is expressed as follows:

$$g(I) = g_0/(1 + I/I_{sat}) \tag{13}$$

where $g_0$ indicates a gain factor without a light input and $I_{sat}(=h\nu \cdot m_{sat})$ indicates saturated light intensity.

A light incident on the semiconductor optical amplifier is amplified during propagation, whereas its gain decreases with increasing light intensity as shown in Equation 13. When the gain equals the waveguide loss (α), a net gain becomes zero. Subsequently, the light intensity does not increase. The light intensity Ic is expressed as follows:

$$Ic = (g_0/\alpha - 1)I_{sat} \tag{14}$$

If the length L of the semiconductor optical amplifier is so small that the light intensity does not reach Ic, the output light intensity of the semiconductor optical amplifier varies depending on the input light intensity. If, however, L is sufficiently large, the semiconductor optical amplifier has a fixed output light intensity Ic irrespective of the input light intensity.

(Fifth Embodiment)

Figure 9:
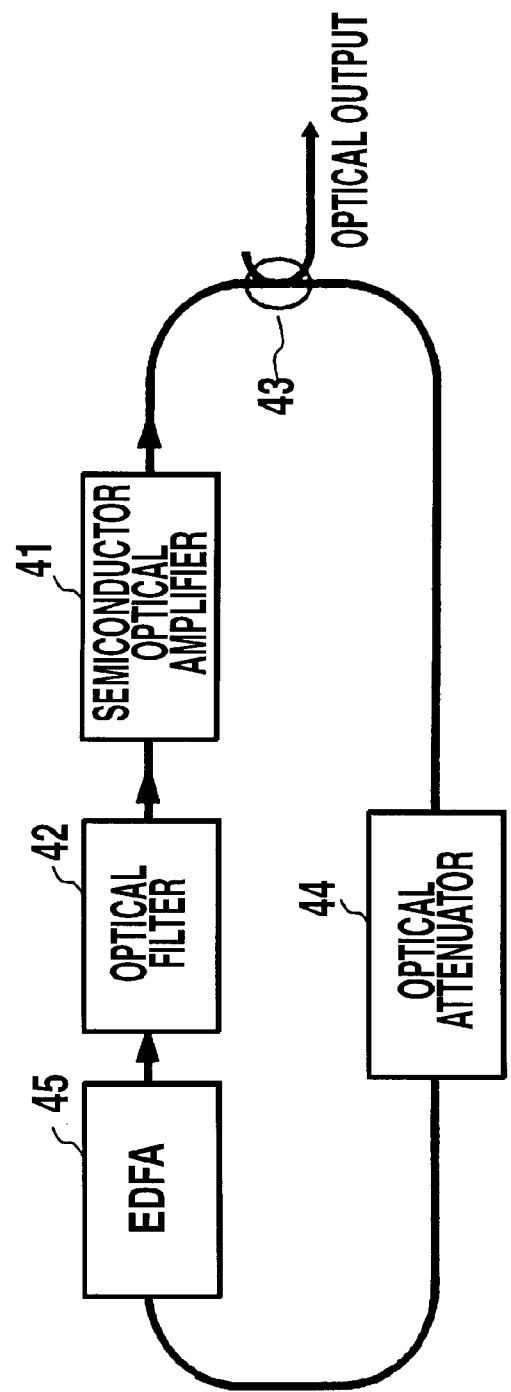
FIG. 9 shows a fifth embodiment of a stabilized single-mode light source according to the present invention.

FIG. 9 shows a fifth embodiment of a stabilized single-mode light source according to the present invention. The stabilized single-mode light source according to this embodiment is comprised of an erbium-doped optical-fiber amplifier acting as a wide-band white-light source (EDFA, reference①) 45, the optical filter 42, the semiconductor optical amplifier 41 with gain saturation, the optical power divider 43, and the optical attenuator 44, all of which are connected together in the form of a ring, wherein a light output (a single-mode light) is externally obtained from the optical power divider 43.

The optical filter 42, the EDFA 45, and the semiconductor optical amplifier 41 may be arranged in this order. In addition, the EDFA may be comprised of two sections having the optical filter 42 located therebetween.

The EDFA 45 is characterized by its outputs larger than spontaneous emissions from the semiconductor optical amplifier 41 and enables a wavelength to be selected from a wide wavelength range. In addition, by independently controlling the output from the EDFA 45 and the optical attenuator 44, the input light intensity of the semiconductor optical amplifier 41 can be controlled while keeping the net loss to the optical ring constant. This function is convenient in keeping constant the net loss that directly affects the spectral bandwidth in order to regulate the optical ring without the need to change the spectral bandwidth. Consequently, the configuration of this embodiment can compensate for the variation of the characteristics of the semiconductor optical amplifier 41 to optimize the optical ring.

According to the configurations of the fourth and fifth embodiments shown above, the wavelength of the output light (single-mode light) is selected and fixed by the optical filter 42. An optical filter capable of varying the selected wavelength is required for varying the wavelength of the output light (single-mode light). In a sixth and a seventh embodiments, which are shown below, an example of the configuration of the fourth embodiment shown in FIG. 8 is shown in which a wide-band continuous wavelength-tunable filter is used instead of the optical filter 42. This example is similarly applicable to the fifth embodiment shown in FIG. 9.

The continuous wavelength-tunable filter is shown in the sixth embodiment as a disc-shaped wavelength-tunable optical filter comprised of a dielectric multilayer film filter with a circularly changed center transmission wavelength (reference②: Y. Katagiri et al., "Synchro-Scanned Rotating Tunable Optical Disc Filter for Wavelength Discrimination", IEEE Photonics Technology Letters, vol.10, no.3, 1998), and in the seventh embodiment as an acoustooptical wavelength-tunable optical filter (reference③: Jiro KOYAMA et al., "Light Wave Electronic Engineering", Corona Co., Ltd.).

(Sixth Embodiment)

Figure 10:
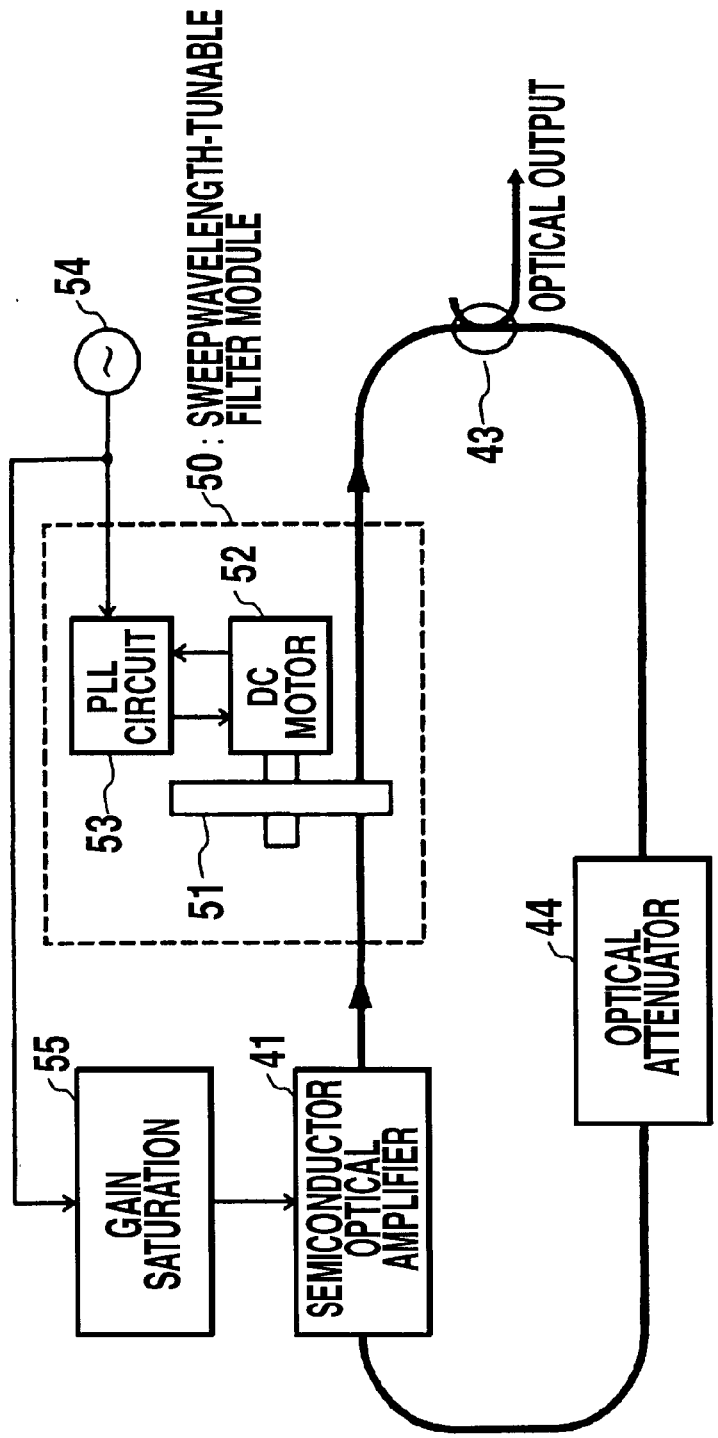
FIG. 10 shows a sixth embodiment of a stabilized single-mode light source according to the present invention.

FIG. 10 shows a sixth embodiment of a stabilized single-mode light source according to the present invention. The stabilized single-mode light source according to this embodiment has a sweep wavelength-tunable filter module 50 including the disc-shaped wavelength-tunable filter 41, instead of the optical filter 42 in the fourth embodiment.

The sweep wavelength-tunable filter module 50 is comprised of a disc-shaped wavelength-tunable filter 51, a DC servo motor 52 for rotating the filter 51, and a PLL circuit 53 for controlling rotation of the filter 51, and sweeps a selected wavelength in synchronism with an external clock 54 input to the disc-shaped wavelength-tunable filter 51. The rotation of the disc-shaped wavelength-tunable filter 51 must be sufficiently slower than the circulation through the optical ring. Since a typical rotation speed is 200 rps at most, a stable output light can be obtained while preventing attenuated circulation of a light from being affected by the rotation speed.

In addition, the semiconductor optical amplifier 41 has different gains depending on the selected wavelength, so that the light source includes a gain control section 55 synchronizing with the external clock 54, for controlling the gain of the semiconductor optical amplifier 41 in synchronism with switching of the selected wavelength. To control the gain, for example, the value of a bias current injected into the semiconductor optical amplifier 41 is controlled.

Although this embodiment has been described in conjunction with the example in which the disc-shaped wavelength-tunable filter is used as a continuous wavelength-tunable filter, a linear wavelength-tunable filter comprised of a dielectric multilayer film filter with a linearly changed center transmission wavelength may be used and linearly moved.

(Seventh Embodiment)

Figure 11:
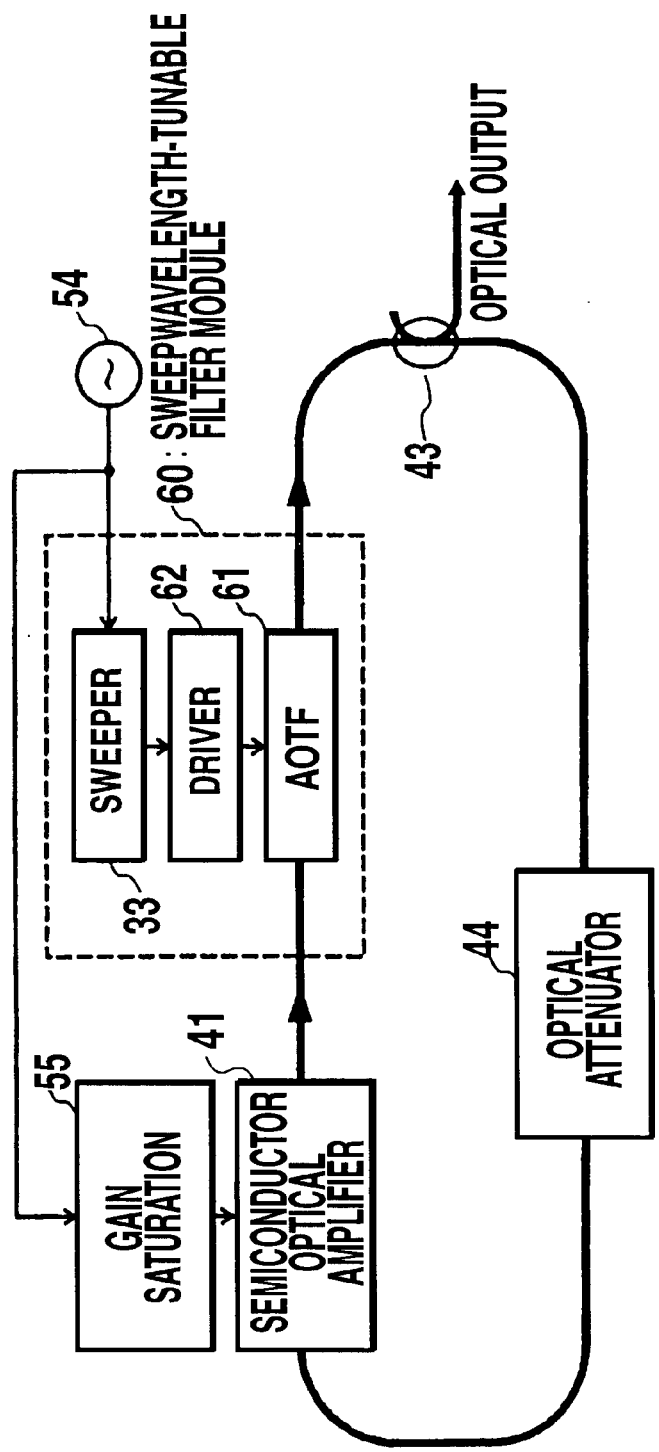
FIG. 11 shows a seventh embodiment of a stabilized single-mode light source according to the present invention.

FIG. 11 shows a seventh embodiment of a stabilized single-mode light source according to the present invention. The stabilized single-mode light source according to this embodiment has a sweep wavelength-tunable filter module 60 including an acoustooptical wavelength-tunable optical filter (AOTF) 61, instead of the optical filter 42 in the fourth embodiment.

The sweep wavelength-tunable optical filter module 60 is comprised of the AOTF 61 for selecting a wavelength depending on the frequency of an applied RF signal, a driver 62 for applying a RF signal to the AOTF 61, and a sweeper 63 for sweeping the frequency of a RF signal. The module 60 sweeps the selected wavelength synchronously with an external clock 54 input to the sweeper 63. Since the sweep speed of the AOTF 61 is very high due to its dependence on an electric circuit, it must be set taking into account the time required for circulation through the optical ring. If the sweep speed becomes higher than the circulation speed, the selected wavelength is changed before a noise wave has sufficiently circulated through the optical ring, thereby making it difficult to restrain intensity noise. The gain control section 55 is similar to that in the sixth embodiment.

(Eighth Embodiment)

Figure 12:
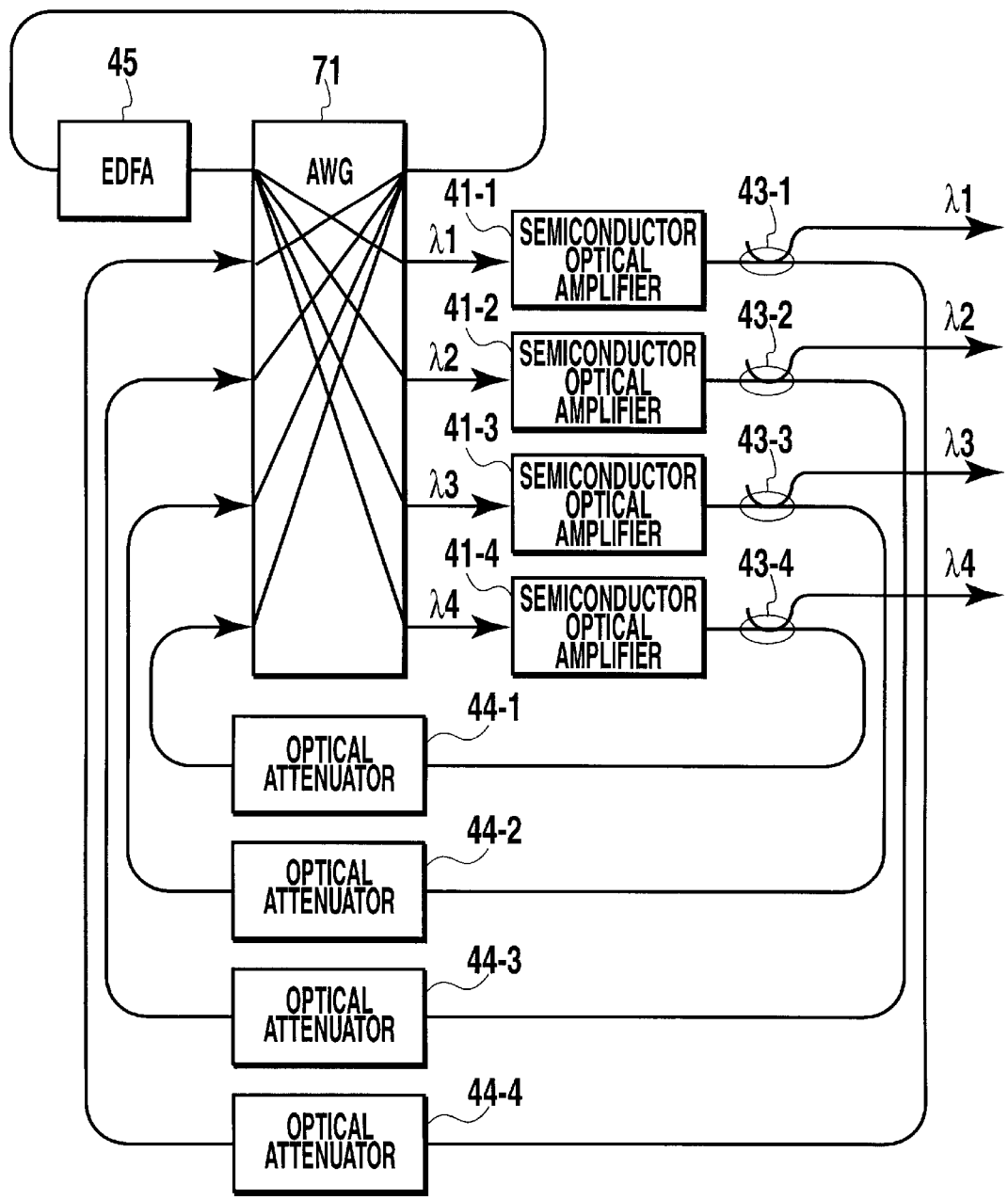
FIG. 12 shows an eighth embodiment of a stabilized single-mode light source according to the present invention.

FIG. 12 shows an eighth embodiment of a stabilized single-mode light source according to the present invention. The stabilized single-mode light source according to this embodiment is characterized in that the wavelength-tunable filter 42 in the fifth embodiment shown in FIG. 9 is replaced with an array waveguide grating filter (AWG) 71 to obtain single-mode lights of a plurality of wavelengths at a time. The semiconductor optical amplifier 41, the optical power divider 43, and the optical attenuator 44 correspond to different wavelengths obtained by the AWG 71 by means of splitting. The AWG 71 is further used as an optical merger to merge lights of corresponding wavelengths together and then to input the merged light to the EDFA 45.

The AWG 71 is comprised of an input waveguide, a first fan-shaped slab waveguide, a waveguide array consisting of a plurality of waveguides each having a sequentially larger length, a second fan-shaped slab waveguide, and an output waveguide, all of which are connected in this order. The AWG 71 functions as a merger/splitter.

A wide-band white-light output from the EDFA 45 is split into a plurality of wavelengths $\lambda 1$, $\lambda 2$, $\lambda 3$, $\lambda 4$. That is, a plurality of bands pass through the AWG 71. Since the bands have corresponding intensity noises that are not correlated to one another (that belong to different populations), they are individually input to semiconductor optical amplifiers 41-1 to 41-4 with gain saturation. Part of a light passing through each of the semiconductor optical amplifiers 41-1 to 41-4 is branched to the exterior via a corresponding one of the optical power dividers 43-1 to 43-4, while the remaining part is input to a corresponding one of the subsequent optical attenuators 44-1 to 44-4. A light passing through each of the optical attenuators 44-1 to 44-4 is input to a predetermined port of the AWG 71 and merged with one port before being input to the EDFA 45.

By arranging the optical attenuators 44-1 to 44-4 so as to correspond to each splitting channel, laser oscillation can be prevented even at particular wavelengths based on the dependence of the gain on the wavelength, thereby obtaining generally equal light outputs at all wavelengths.

In addition, in each of the above embodiments, an optical isolator may be placed at an appropriate position for defining a light propagation direction in the optical ring.

(Ninth Embodiment)

Figure 13:
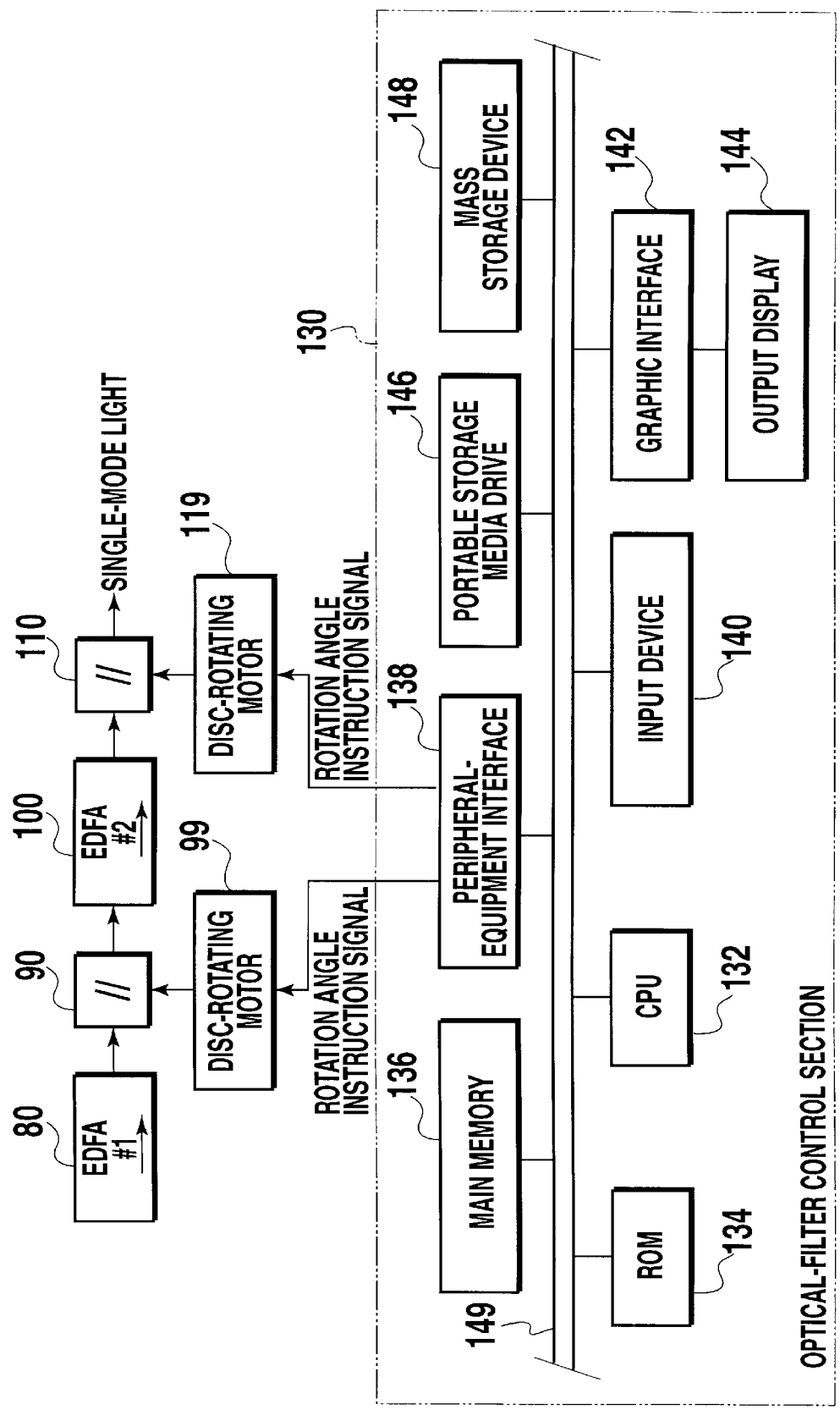
FIG. 13 shows a ninth embodiment of a light generation method and a light source according to the present invention.

FIG. 13 shows a ninth embodiment of a light generation method and a light source according to the present invention. According to the ninth embodiment, a plurality of wavelength-tunable optical filters 90, 110 are used to output a single-mode light having wavelength components over a particular band of a white-light band by obtaining this light from a white-light having wavelength components over a wide band in wavelength domain.

This light source is comprised of optical amplifiers 80, 100 that are ermium-doped optical-fiber amplifiers, wavelength-tunable optical filters 90, 110 that are disc-shaped optical filters, a disc rotating motor 99 for rotating a disc-shaped filter of the wavelength-tunable optical filter 90, a disc rotating motor 119 for rotating a disc-shaped filter of the wavelength-tunable optical filter 110, and an optical-filter control section 130 for outputting rotation angle instruction signals to the disc rotating motors 99, 119 to control the transmission bands of the wavelength-tunable optical filters 90, 110 as shown in FIG. 13. A white-light from the optical amplifier 100 is filtered on passing through the wavelength-tunable optical filter 90, the optical amplifier 100, and the wavelength-tunable optical filter 110 in this order.

The optical-filter control section 130 is composed of a CPU for controlling calculations and the entire system based on control program a ROM 134 for storing the control programs of the CPU 132 in predetermined areas beforehand, a main memory 136 for storing data read from the ROM 134 or the like as well as calculation results required for calculation processes executed by the CPU 132, a peripheral-equipment interface 138 for communicating data outputs to the disc rotating motors 99, 119, an input device 140 consisting of a keyboard, a mouse, etc. for enabling data inputs as a human interface, a graphic interface 132 for converting display data stored in a particular area of the main memory 136 into an image signal and outputting it, an output display 134 for displaying a screen based on the image signal, a portable storage media drive 136, and a mass storage device 138. These devices 132 to 142 are connected together via a bus 149 so as to transmit and receive data, wherein the bus acts as a signal line for transferring data.

The main memory 136 has a VRAM that is a particular area for storing display data for display on an output display 144, and the VRAM is independently accessible from the graphic interface 142 and the CPU 132. The graphic interface 142 sequentially reads display data from the VRAM with a predetermined cycle starting with a leading address, and converts read display data into an image signal to output it to the output display 144.

Figure 14:
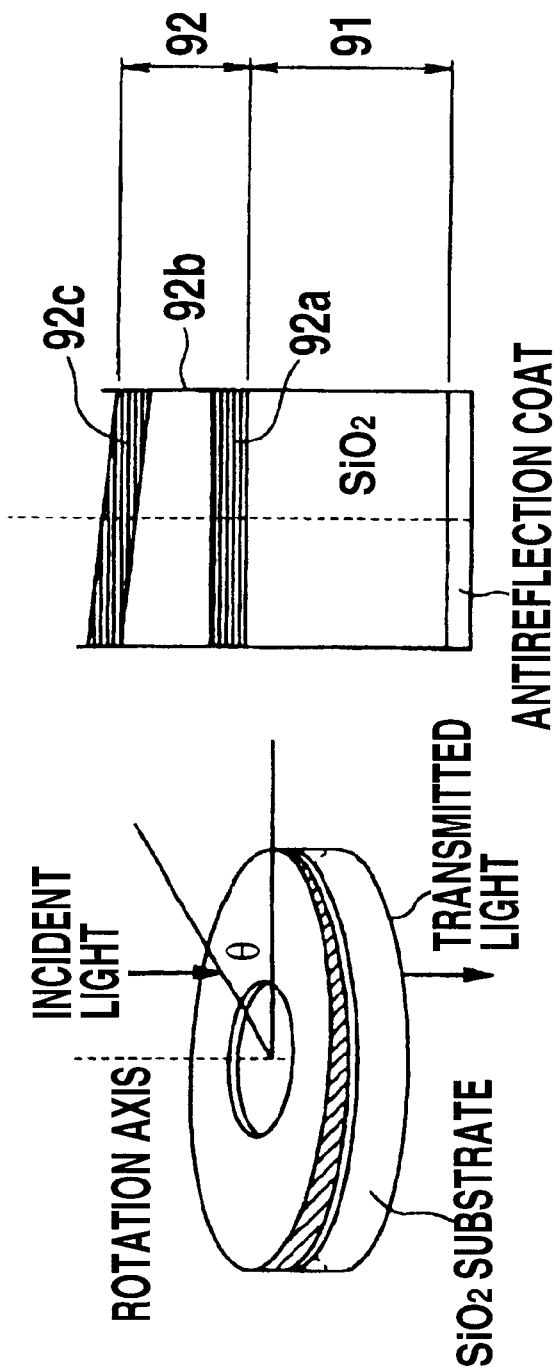
FIGS. 14A and 14B show a configuration of a wavelength-tunable optical filter.
Figure 15:
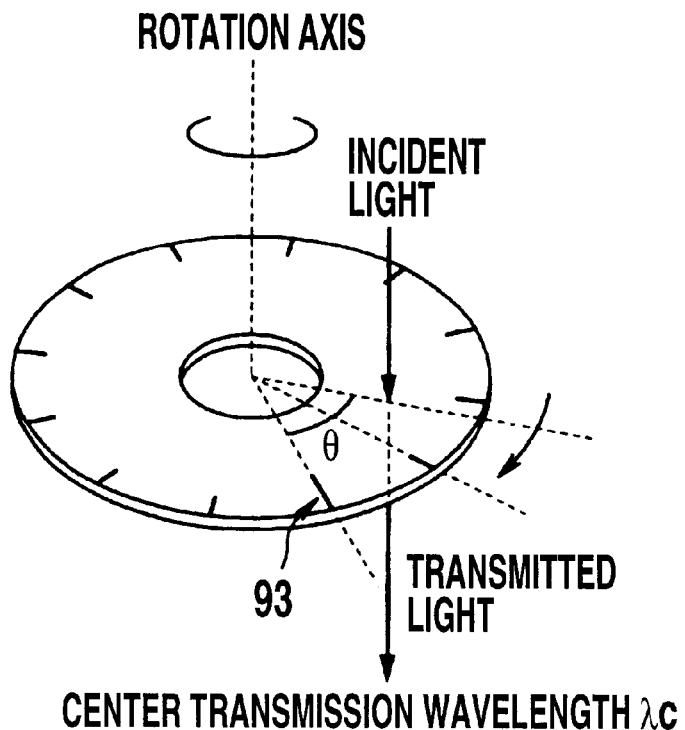
FIG. 15 shows a configuration of a wavelength-tunable optical filter.
Figures 16A, 16B:
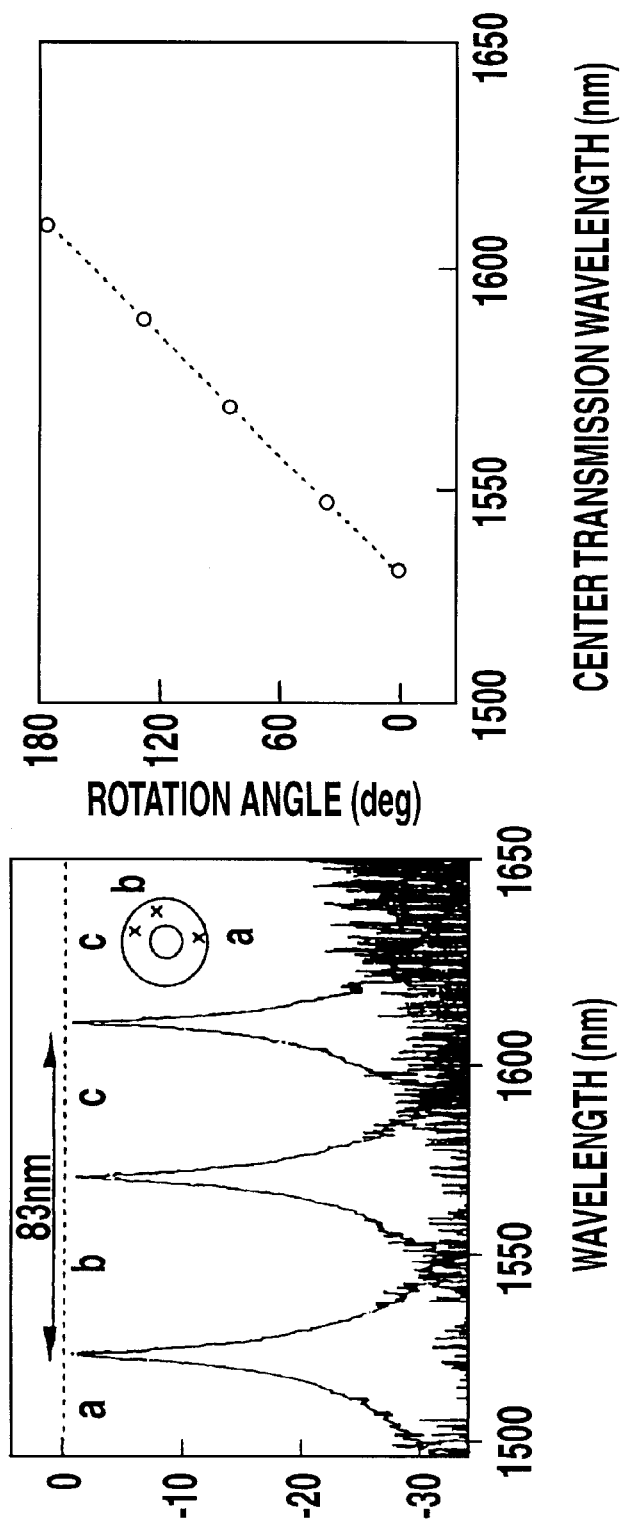
FIGS. 16A and 16B show filtering characteristics of the wavelength-tunable optical filter.

Next, a configuration of the wavelength-tunable optical filters 90, 110 will be described with reference to FIGS. 14 to 16. FIGS. 14 and 15 show the configuration of the wavelength-tunable optical filters 90, 110, and FIG. 16 shows a filtering characteristic of the wavelength-tunable optical filters 90, 110.

Since the wavelength-tunable optical filters 90, 110 are configured to have identical functions, only the configuration of the wavelength-tunable optical filter 90 will be explained and the description of the wavelength-tunable optical filter 110 will be omitted.

The wavelength-tunable optical filter 90 is a disc-shaped optical filter having a predetermined transmission bandwidth and a circularly changed center transmission wavelength, as shown in FIG. 14. The optical filter 90 carries out filtering by varying the center transmission wavelength depending on the rotation angle of the disc-shaped filter to allow a light to enter a disc surface at a fixed position thereof to pass through in a rotation axis direction.

The disc-shaped filter of the wavelength-tunable optical filter 90 is comprised of a glass layer 91 consisting of $SiO_2$ and acting as a substrate layer and a filter layer 92 deposited thereon and having a circularly changed center transmission wavelength. The filter layer 92 is comprised of a typical dielectric multilayer film comprised of a high-reflectivity layer 92a having a fixed thickness along a circumferential direction, a wedge layer 92b laminated thereon and having a thickness varying in the circumferential direction (the thickness increases in proportion to an increase in central angle between 0 and $\pi$, while decreasing in proportion to an increase in central angle between $\pi$ and $2\pi$), and a high-reflectivity layer 92c having a fixed thickness along the circumferential direction. The transmission wavelength and the transmission bandwidth are determined by the structure of the filter layer 92, and in particular, the center transmission wavelength is determined by the thickness of the wedge layer 92b of the filter layer 92. A disc surface opposed to the glass layer 91 is covered with a wide-band anti-reflection coating.

The disc-shaped filter 91 has a filtered light enter its surface on the side of the filter layer 91 at a fixed position of the surface and also has a plurality of marks 93 circularly provided on its outer periphery at predetermined intervals, as shown in FIG. 15. The optical filter control section 130 uses an optical reader (not shown) to read the marks 93 to control the viewing-angle of the disc-shaped filter.

The disc-shaped filter of the wavelength-tunable optical filter 90 has a filtering characteristic such as one shown in FIG. 16 and shows a Lorentzian spectrum profile. The center transmission wavelength and the rotation angle of the disc-shaped filter have a generally linear relationship.

Referring back to FIG. 13, the ROM 134 stores data of center transmission wavelengths versus control parameters of optical filters, the data being used to determine the transmission bandwidths of the wavelength-tunable optical filters 90, 110 and comprising different center transmission wavelengths of the wavelength-tunable optical filters 90, 110 associated with corresponding rotation angles of the disc-shaped filters.

The CPU 132 is comprised of a microprocessing unit MPU or the like, and to control the wavelength-tunable optical filters 90, 110, the CPU 132 activates a corresponding control program stored in a predetermined area of the ROM 134 to execute processing required for controlling the wavelength-tunable optical filters 90, 110.

In this control processing, when a center transmission wavelength is input from the input device 140 or the like as an instructive value of the center transmission wavelength of the wavelength-tunable optical filters 90, 110, the data of center transmission wavelengths versus control parameters of optical filters is read from the ROM 134, and a rotating angle instruction signal is simultaneously output to the disc rotating motors 99, 119 based on this data so that the center transmission wavelength of the transmission band of the wavelength-tunable optical filters 90, 110 equals the center transmission wavelength provided as the instructive value.

Figure 17:
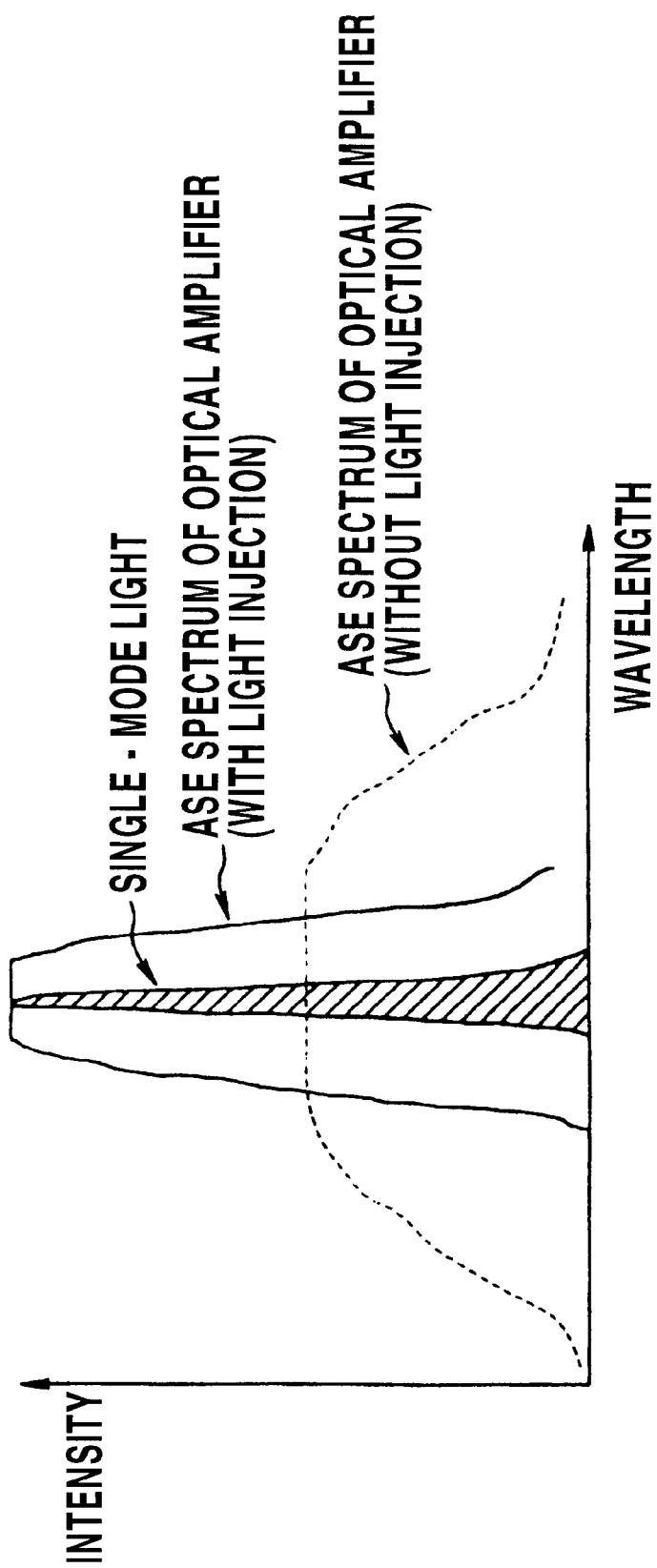
FIG. 17 shows characteristics of the wavelengths of lights output from an optical amplifier and the wavelength-tunable optical filter.

Next, operation of the ninth embodiment will be described with reference to FIG. 17. FIG. 17 is a graph showing characteristics of the wavelengths of lights output from the optical amplifier 100 and the wavelength-tunable optical filter 110.

First, when a center transmission wavelength is input from the input device 140 or the like as instructive value of the center transmission wavelength of the wavelength-tunable optical filters 90, 110, the optical-filter control section 130 reads from the ROM 134 the data of center transmission wavelengths versus control parameters of optical filters, and simultaneously outputs rotation angle instruction signals to the disc rotating motors 99, 119 based on this data so that the center transmission wavelength of the transmission bands of the wavelength-tunable optical filters 90, 110 equals the center transmission wavelength provided as the instructive value. Based on the input rotation angle instruction signal, the disc rotating motors 99, 119 rotate the disc-shaped filters of the wavelength-tunable optical filters 90, 110 to equalize the center transmission wavelength of the wavelength-tunable optical filters 90, 110 with the center transmission wavelength provided as the instructive value.

Once the center transmission wavelength of the wavelength-tunable optical filters 90, 110 has been determined, the optical amplifier 80 outputs a white-light containing a spontaneous emission, which is first filtered by the wavelength-tunable optical filter 90. Thus, since components in the white-light band other than those in a particular band around the center transmission wavelength are filtered, a light transmitted through the wavelength-tunable optical filter 90 has only the components in the particular band around the center transmission wavelength.

Then, the light transmitted through the wavelength-tunable optical filter 90 is amplified by the optical amplifier 100 and filtered by the wavelength-tunable optical filter 110. After this amplification, the light transmitted through the wavelength-tunable optical filter 90 contains the spontaneous emission amplified by the optical amplifier 100, but this spontaneous emission is filtered by the subsequent wavelength-tunable optical filter 110. As a result, wavelength components in the white-light from the optical amplifier 80 other than those in a predetermined transmission band around the center transmission wavelength of the wavelength-tunable optical filters 90, 110 are filtered, while the wavelength components in the predetermined transmission band around the center transmission wavelength of the wavelength-tunable optical filters 90, 110 are amplified.

Then, the light transmitted through the wavelength-tunable optical filter 110 is output as a single-mode light. The single-mode light is obtained by carrying out processing comprising such amplification and filtering at least once.

In this manner, this embodiment is comprised of the optical amplifiers 80, 100 and the wavelength-tunable optical filters 90, 100 having a predetermined transmission bandwidth and a predetermined center transmission wavelength so that a white-light from the optical amplifier 80 is filtered by the wavelength-tunable optical filter 90, so that a light transmitted through the wavelength-tunable optical filter 90 is amplified by the optical amplifier 100, and so that an amplified light from the optical amplifier 100 is filtered by the wavelength-tunable optical filter 110 to obtain a light transmitted through the wavelength-tunable optical filter 110, as a single-mode light. Accordingly, wavelength components in the white-light from the optical amplifier 80 other than those in a predetermined transmission band around the center transmission wavelength of the wavelength-tunable optical filters 90, 110 are filtered, while the wavelength components in the predetermined transmission band around the center transmission wavelength of the wavelength-tunable optical filters 90, 110 are amplified, thereby providing a high-output single-mode light without degrading the spectral purity. of the single-mode light, compared to the prior art.

In addition, according to this embodiment, the wavelength-tunable optical filters 90, 110 are each a disc-shaped optical filter having a predetermined transmission bandwidth and a circularly changed center transmission wavelength; when a center transmission wavelength is provided as instructive value, the optical-filter control section 130 reads from the ROM 134 the data of center transmission wavelengths versus control parameters of optical filters, and controls the rotation angles of the disc-shaped filters of the wavelength-tunable optical filters 90, 110 based on the read data so that the center transmission wavelength of the transmission bands of the wavelength-tunable optical filters 90, 110 equals the center transmission wavelength provided as the instructive value. Consequently, the center transmission wavelength of the wavelength-tunable optical filters 90, 110 can be varied at a high speed despite the very simple configuration, thereby not only enabling the size and costs of the conventional filter module to be substantially reduced but also enabling the center transmission wavelength of the wavelength-tunable optical filters 90, 110 to be varied with timings required by the system.

Figure 18:
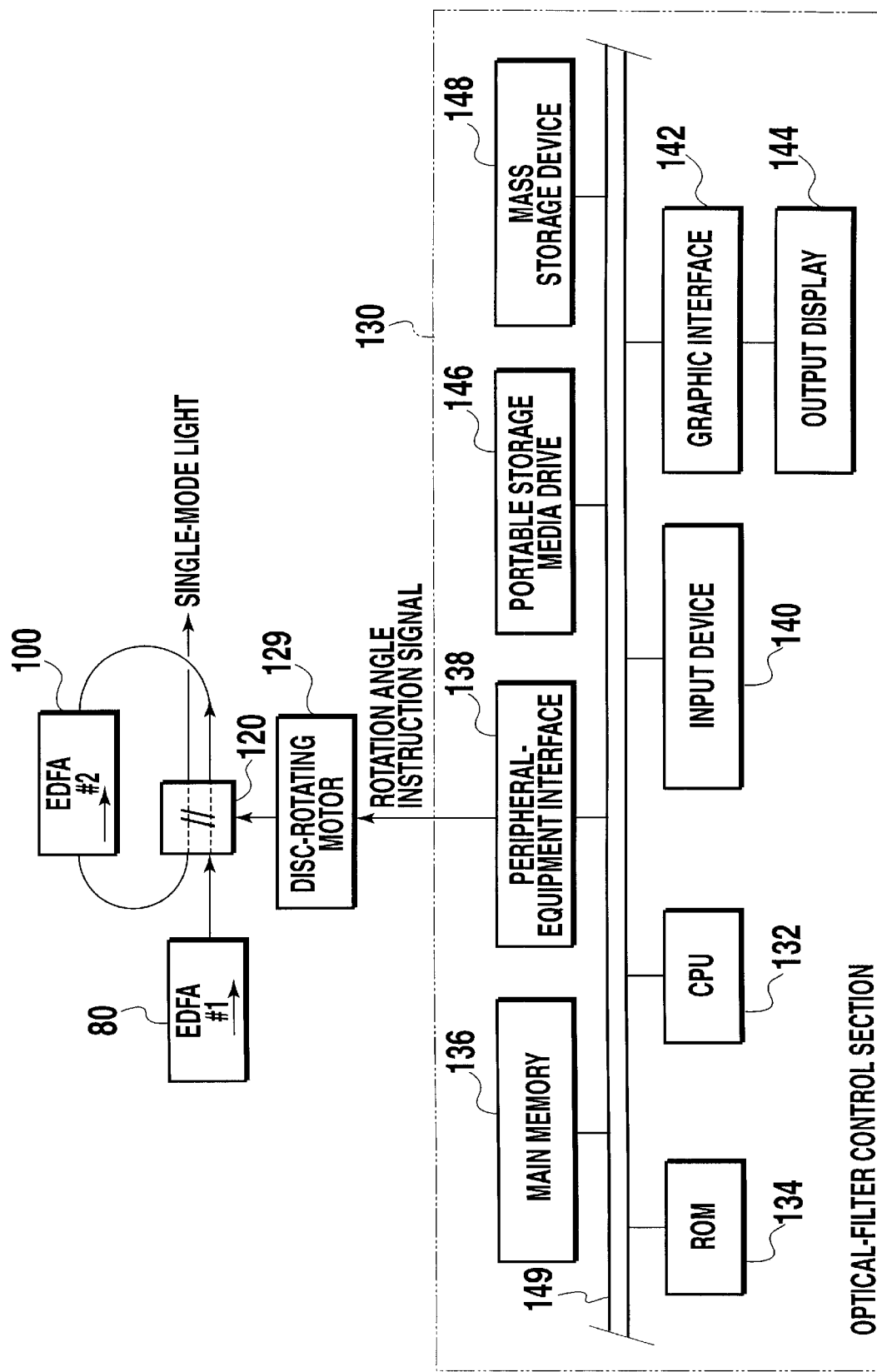
FIG. 18 shows a tenth embodiment of a light generation method and a light source according to the present invention.

Next, a tenth embodiment of the present invention will be explained with reference to the corresponding drawings. FIG. 18 shows the tenth embodiment of a light. generation method and a light source according to the present invention.

The tenth embodiment is an application to a case in which a single wavelength-tunable optical filter 120 is used to output a single-mode light having components in a particular band of a white-light band by obtaining this light from a white-light having wavelength components over a wide-band in the wavelength domain. Only those components of this embodiment that are not included in the ninth embodiment will be described below, while the description of duplicate portions will be omitted.

This light source is composed of the optical amplifiers 80, 100, the wavelength-tunable optical filter 120 that is a disc-shaped filter, a disc rotating motor 129 for rotating a disc-shaped filter of the wavelength-tunable optical filter 120, and an optical-filter control section 130 so that a white-light from the optical amplifier 80 is filtered as it passes through the wavelength-tunable optical filter 120, the optical amplifier 100, and the wavelength-tunable optical filter 120 in this order.

Figure 19:
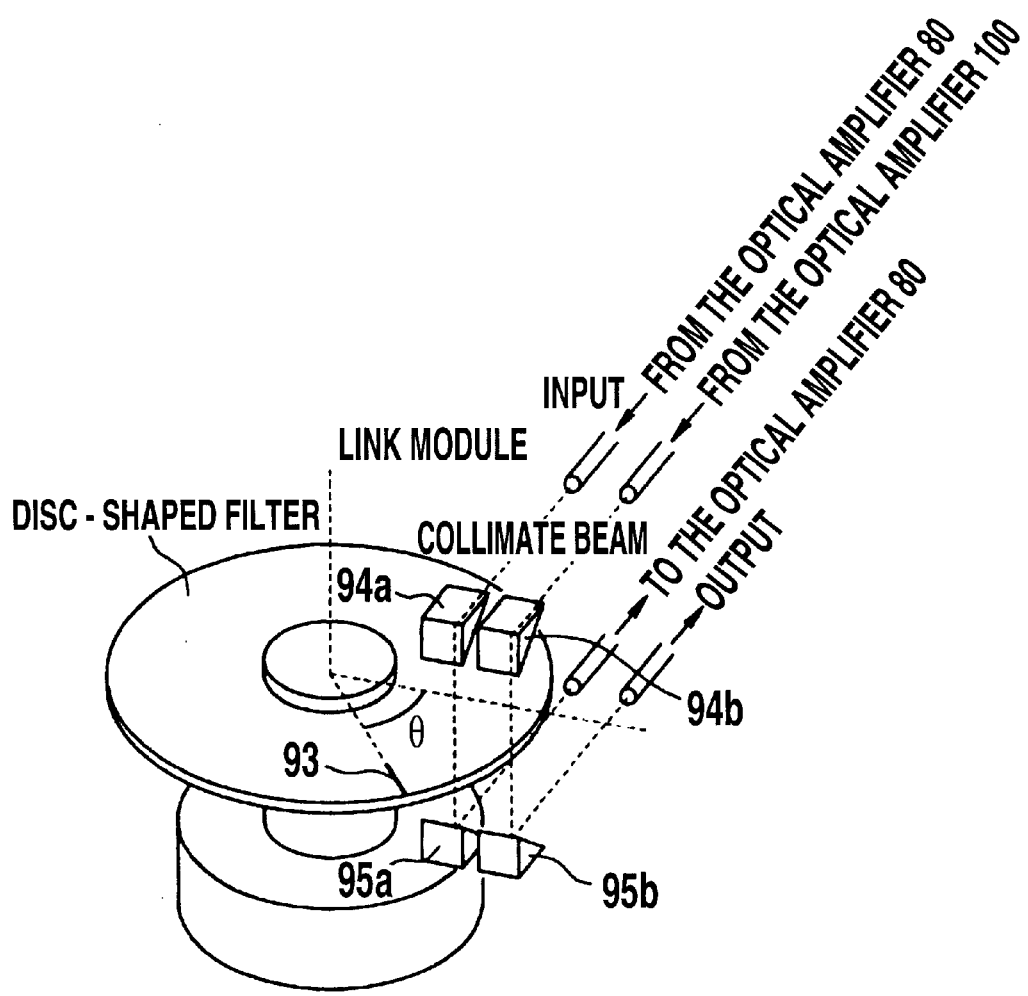
FIG. 19 is a block diagram showing a configuration of a light source according to the tenth embodiment.
Figure 20:
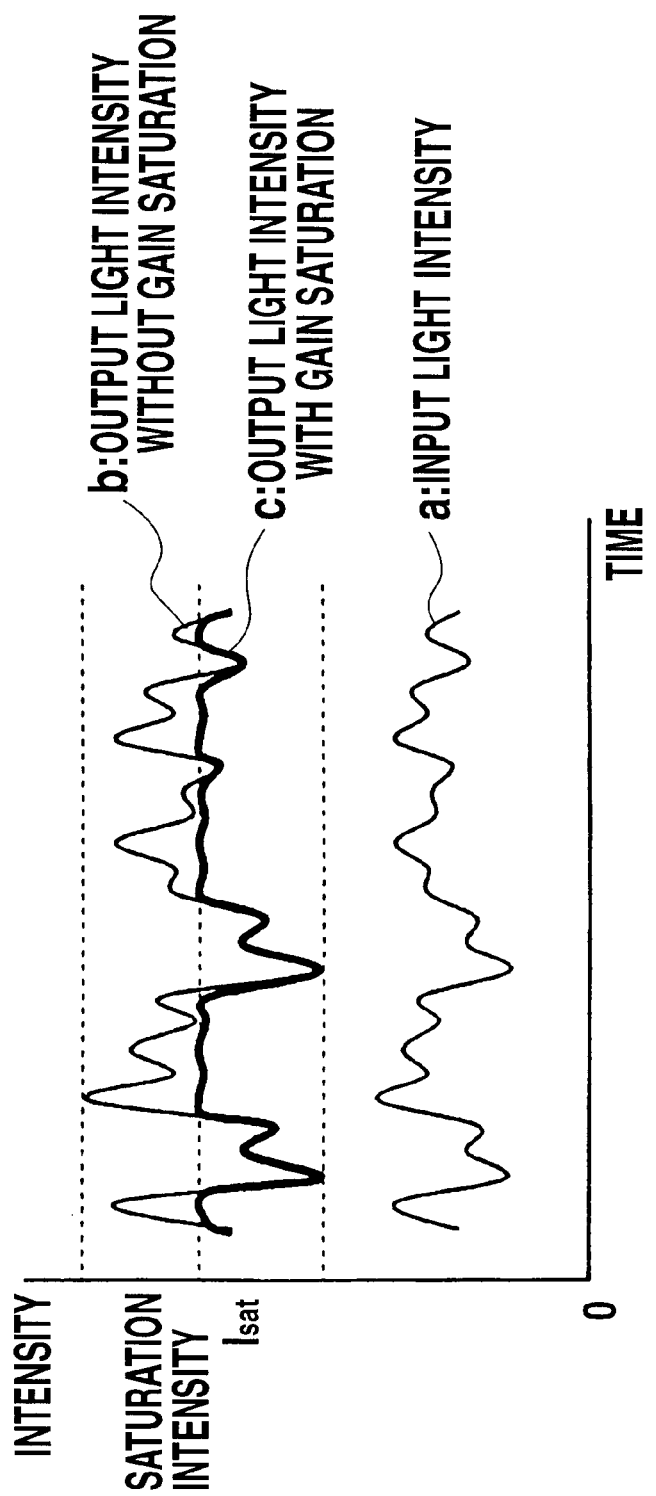
FIG. 20 describes an intensity noise reduction mechanism using gain saturation of the optical amplifier.
Figure 21:
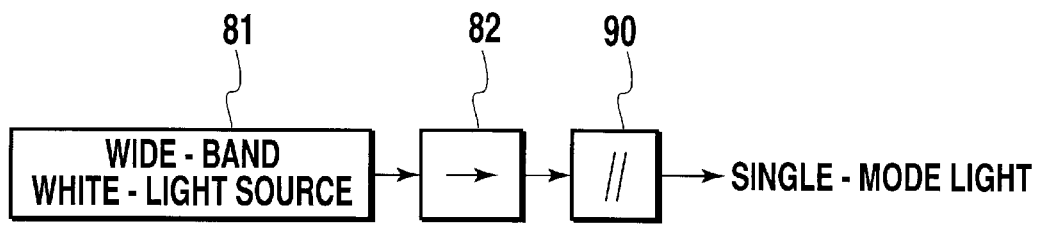
FIG. 21 describes a mechanism for filtering a wide-band white-light using the optical filter to obtain a single-mode light.
Figure 22:
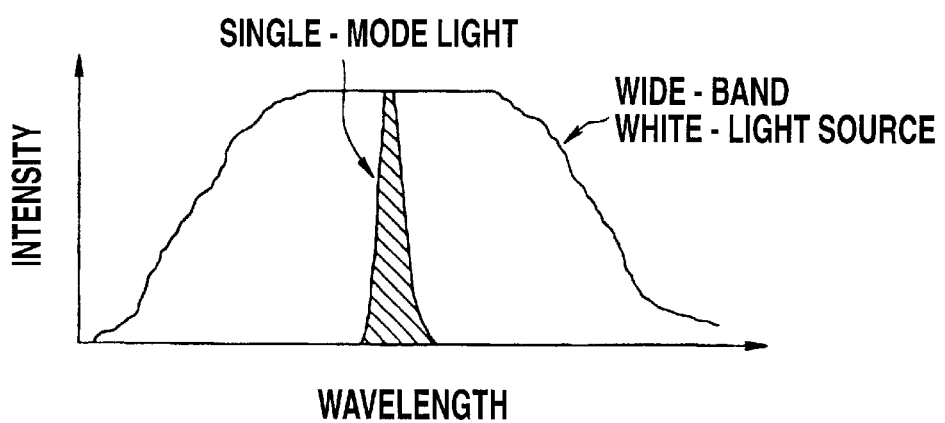
FIG. 22 shows a conventional single-mode light source.

Next, a configuration of the wavelength-tunable optical filter 120 will be described with reference to FIG. 19. In the wavelength-tunable optical filter 120, a path for collimate beams through an optical fiber joining the optical amplifier 80 and the wavelength-tunable optical filter 120 together and an optical fiber joining the optical amplifier 100 and the wavelength-tunable optical filter 120 is formed as a folding path using prism mirrors 94a, 94b, 95a, 95b. As seen in FIG. 19, the disc-shaped filter has two prism mirrors 94a, 94b arranged on its side of the filter layer 92 along a radial direction of the disc at locations close to each other and to a disc-shaped filter surface, and also has two prism mirrors 95a, 95b arranged on its side of the glass layer 91 at locations opposed to the prism mirrors 94a, 94b relative to the disc-shaped filter surface and at locations close to each other and to the disc-shaped filter surface.

When a white-light from the optical amplifier 80 is input to the prism mirror 94a from a radial direction of the disc-shaped filter through the optical fiber or the like, this incident light is reflected in the rotation axis direction of the disc-shaped filter and then output to the prism mirror 95a through the disc-shaped filter. When a light transmitted through the disc-shaped filter is input to the prism mirror 95a, this incident light is reflected in the radial direction of the disc-shaped filter and then output to the optical amplifier 100 through the optical fiber or the like.

On the other hand, when an amplified light from the optical amplifier 100 is input to the prism mirror 94b from the radial direction of the disc through the optical fiber or the like, this incident light is reflected in the rotation axis direction of the disc-shaped filter and then. output to the prism mirror 95b through the disc-shaped filter. When a light transmitted through the disc-shaped filter is input to the prism mirror 95b, this incident light is reflected in the radial direction of the disc-shaped filter and then output as a single-mode light through the optical fiber or the like.

In this manner, since the prism mirrors 94a, 94b and the prism mirrors 95a, 95b are arranged close to each other in the radial direction of the disc-shaped filter, the center transmission wavelength in the path from the prism mirror 94a to the prism mirror 95a is almost equal to the center transmission wavelength in the path from the prism mirror 94b to the prism mirror 95b. In this case, the transmission bandwidths of these two paths are almost equal.

Next, operation of the tenth embodiment will be described. First, when a center transmission wavelength is input from the input device 140 or the like as instructive value of the center transmission wavelength of the wavelength-tunable optical filter 120, the optical-filter control section 130 reads from the ROM 134 the data of center transmission wavelengths versus control parameters of optical filters, and outputs a rotation angle instruction signal to the disc rotating motor 129 based on this data so that the center transmission wavelength of the transmission band of the wavelength-tunable optical filter 120 equals the center transmission wavelength provided as the instructive value. Based on the input rotation angle instruction signal, the disc rotating motor 129 rotates the disc-shaped filter of the wavelength-tunable optical filter 120 to equalize the center transmission wavelength of the wavelength-tunable optical filter 120 with the center transmission wavelength provided as the instructive value.

Once the center transmission wavelength of the wavelength-tunable optical filter 120 has been determined, the optical amplifier 80 outputs a white-light containing a spontaneous emission, which is first filtered by the wavelength-tunable optical filter 120. Thus, since components in the white-light band other than those in a particular band around the center transmission wavelength are filtered, a light transmitted through the wavelength-tunable optical filter 120 has only the components in the particular band around the center transmission wavelength.

Then, the light transmitted through the wavelength-tunable optical filter 120 is amplified by the optical amplifier 100 and filtered by the wavelength-tunable optical filter 120 again. After this amplification, the light transmitted through the wavelength-tunable optical filter 120 contains the spontaneous emission amplified by the optical amplifier 100, but this spontaneous emission is filtered by the subsequent wavelength-tunable optical filter 120. As a result, wavelength components in the white-light from the optical amplifier 120 other than those in a predetermined transmission band around the center transmission wavelength of the wavelength-tunable optical filter 120 are filtered, while the wavelength components in the predetermined transmission band around the center transmission wavelength of the wavelength-tunable optical filter 120 are amplified.

Then, the light transmitted through the wavelength-tunable optical filter 120 is output as a single-mode light. The single-mode light is obtained by carrying out processing comprising such amplification and filtering at least once.

In this manner, this embodiment is comprised of the optical amplifiers 80, 100 and the wavelength-tunable optical filter 120 having a predetermined transmission bandwidth and a predetermined center transmission wavelength so that a white-light from the optical amplifier 80 is filtered by the wavelength-tunable optical filter 120, so that a light transmitted through the wavelength-tunable optical filter 120 is amplified by the optical amplifier 100, and so that an amplified light from the optical amplifier 100 is filtered by the wavelength-tunable optical filter 120 again to obtain a light transmitted through the wavelength-tunable optical filter 120, as a single-mode light. Accordingly, wavelength components in the white-light from the optical. amplifier 80 other than those in a predetermined transmission band around the center transmission wavelength of the wavelength-tunable optical filter 120 are filtered, while the wavelength components in the predetermined transmission band around the center transmission wavelength of the wavelength-tunable optical filter 120 are amplified, thereby providing a high-output single-mode light without degrading the spectral purity of the single-mode light, compared to the prior art.

In addition, according to this embodiment, the wavelength-tunable optical filter 120 is a disc-shaped optical filter having a predetermined transmission bandwidth and a circularly changed center transmission wavelength; when a center transmission wavelength is provided as instructive value, the optical-filter control section 130 reads from the ROM 134 the data of center transmission wavelengths versus control parameters of optical filters, and controls the rotation angles of the disc-shaped filters of the wavelength-tunable optical filter 120 based on the read data so that the center transmission wavelength of the transmission bands of the wavelength-tunable optical filter 120 equals the center transmission wavelength provided as the instructive value. Consequently, the center transmission wavelength of the wavelength-tunable optical filter 120 can be varied at a high speed despite the very simple configuration, thereby not only enabling the size and costs of the conventional filter module to be substantially reduced but also enabling the center transmission wavelength of the wavelength-tunable optical filter 120 to be varied with timings required by the system.

Furthermore, according to this embodiment, the path for collimate beams through the optical fiber joining the optical amplifier 80 and the wavelength-tunable optical filter 120 together and the optical fiber joining the optical amplifier 100 and the wavelength-tunable optical filter 120 is formed as a folding path using the prism mirrors 94a, 94b, 95a, 95b. Consequently, a high-output single-mode light can be obtained using the single wavelength-tunable optical filter 120, thereby enabling the filter module to be thin enough to be mounted on a board.

According to the ninth embodiment, a white-light from the optical amplifier 80 is filtered as it passes through the wavelength-tunable optical filter 90, the optical amplifier 100, and the wavelength-tunable optical filter 110 in this order so that a single-mode light is obtained by executing processing comprising such amplification and filtering once. The present invention, however, is not limited to this aspect, but a single-mode light may be obtained by executing processing comprising such amplification and filtering a number of times.

Likewise, according to the tenth embodiment, a white-light from the optical amplifier 80 is filtered as it passes through the wavelength-tunable optical filter 120, the optical amplifier 100, and the wavelength-tunable optical filter 120 in this order so that a single-mode light is obtained by executing processing comprising such amplification and filtering once. The present invention, however, is not limited to this aspect, but a single-mode light may be obtained by executing processing comprising such amplification and filtering a number of times.

In addition, the ninth and tenth embodiments have been described in conjunction with the case in which the corresponding control program stored in the ROM 134 is executed to control the wavelength-tunable optical filters 90 and 110 or the wavelength-tunable optical filter 120. The present invention, however, is not limited to this aspect, but a program indicating a corresponding procedure may be read from a storage medium with this program stored therein to the main memory 136 for execution.

The storage medium may be a semiconductor storage medium such as a RAM or a ROM, a magnetic storage medium such as a FD or a HD, or a magnetic storage/optical reading storage medium such as CD, CDV, LD, or DVD, and includes any storage medium as long as it can be read by a computer whether it uses an electronic, a magnetic, or an optical reading method.

In the ninth and tenth embodiments, the optical-filter control section 130 corresponds to optical-filter control means, the ROM 134 corresponds to storage means, and a white-light from the optical amplifier 80 corresponds to a spontaneous emission.

As described above, the present invention provides a light generation method and a light source for outputting a single-mode light by using an optical filter to filter a white-light having wavelength components over a wide-band in a wavelength domain, wherein the single-mode light is obtained by carrying out, at least once, the process of using an optical amplifier as a light source for generating the white-light, filtering the optical amplifier using the optical filter, and using the amplifier to amplify a light transmitted through the optical filter and filtering the amplified light transmitted through the optical filter using an optical filter having a center transmission wavelength equal to the center transmission wavelength of the above optical filter. Thus, a single-mode light having a small wavelength spectral bandwidth and high outputs can be easily generated at an arbitrary center transmission wavelength.

In addition, the stabilized single-mode light source according to the present invention can easily generate, at an arbitrary wavelength, an incoherent single-mode light having a small wavelength spectral bandwidth and restrained intensity noise.

In particular, the wavelength of a single-mode light can be selected from a wide wavelength range when the light source is comprised of an optical fiber amplifier acting as an optical amplifying medium to output a wide-band white-light and a semiconductor optical amplifier having gain saturation In addition, by independently controlling the excitation level of the optical-fiber amplifier and attenuation provided by the optical attenuator, the light source can compensate for the variation of the characteristics of the semiconductor optical amplifier to optimize an optical ring without the need to change the spectral bandwidth.

Furthermore, since wavelength components of a spontaneous emission other than those in a particular band are filtered, while the wavelength components in the particular band are amplified, a high-output single-mode light can be obtained without degrading its spectral purity, compared to the prior art.

In addition, a high-output single-mode light can be obtained using a single wavelength-tunable optical filter, thereby enabling the filter module to be thin enough to be mounted on a board.

Furthermore, the center transmission wavelength of the optical filter can be varied at a high speed despite the very simple configuration, thereby not only enabling the size and costs of the conventional filter module to be substantially reduced but also enabling the center transmission wavelength of the optical filter to be varied with timings required by the system.

The present invention has been described on detail with respect to preferred embodiments, and it will now be apparent from the foregoing to those skilled in the art that changes and modifications may be made without departing from the invention in its broader aspects, and it is the intention, therefore, in the appended claims to cover all such changes and modifications as fall within the true spirit of the invention.

What is claimed is:

1. A light generation method for outputting a single-mode light by using an optical filter to filter a white-light having wavelength components over a wide-band in a wavelength domain, wherein said single-mode light is obtained by carrying out, at least once, the process of:

using an optical amplifier as a light source for generating said white-light;

filtering said optical amplifier using the optical filter; and using the amplifier to amplify a light transmitted through the optical filter and filtering the amplified light transmitted through the optical filter using an optical filter having a center transmission wavelength equal to the center transmission wavelength of said optical filter.

2. A light generation method for outputting a single-mode light by using an optical filter to filter a white-light having wavelength components over a wide-band in a wavelength domain, comprising:

using an optical amplifier as a light source for generating said white-light;

using an optical power divider to divide a light transmitted through the optical filter into two and providing an optical path through which one of the lights obtained by means of division is fed back to said optical amplifier, in order to form an optical ring;

said optical ring comprising means for circulating a white-light generated by said optical amplifier in a uni-direction and means for adjusting a round-trip gain to restrain laser oscillation; and obtaining single-mode light using, as a light output, that part of the light circulating through said optical ring which corresponds to the other of the lights obtained by means of division by said optical power divider.

3. A light generation method as claimed in claim 1 wherein said optical amplifier has a gain saturation.

4. A light generation method as claimed in claim 2 wherein said optical amplifier has a gain saturation.

5. A light generation method as claimed in claim 3 comprising optical filter control means for controlling the center transmission wavelength of said optical filter, said optical filter control means having a data-storage device for storing data of center transmission wavelength versus control parameters of optical filters for determining the center transmission wavelength of said optical filter, said optical filter control means operative when a center transmission wavelength is provided as an instructive value, for reading said data from said data-storage device and controlling said optical filter based on the read data so that the center transmission wavelength of said optical filter equals the center transmission wavelength provided as the instructive value.

6. A light generation method as claimed in claim 4 comprising optical filter control means for controlling the center transmission wavelength of said optical filter, said optical filter control means having a data-storage device for storing data of center transmission wavelength versus control parameters of optical filters for determining the center transmission wavelength of said optical filter, said optical filter control means operative when a center transmission wavelength is provided as an instructive value, for reading said data from said data-storage device and controlling said optical filter based on the read data so that the center transmission wavelength of said optical filter equals the center transmission wavelength provided as the instructive value.

7. A light generation method for outputting a single-mode light by filtering a spontaneous emission using an optical filter, comprising:

using an optical amplifier as a light source for generating said spontaneous emission;

inputting to said optical amplifier a spontaneous emission having a bandwidth larger than the transmission bandwidth of said optical filter and including the center transmission wavelength of said optical filter in this band in order to increase, in said optical amplifier, the probability density of light emission of said single-mode light near the center transmission wavelength, and using said optical filter to filter the spontaneous emission amplified by said optical amplifier.

8. A light generation method for outputting a single-mode light having wavelength components in a particular band of a spontaneous emission band by obtaining the single-mode light from a spontaneous emission having wavelength components over a wide-band in a wavelength domain, wherein said single-mode light is obtained by carrying out, at least once, the process of:

filtering said spontaneous emission using an optical filter having at least the transmission bandwidth of said particular band; and using an optical amplifier to amplify a light transmitted through the optical filter and filtering the light using the optical filter having at least the transmission bandwidth of said particular band.

9. A light generation method for outputting a single-mode light by filtering a spontaneous emission using an optical filter, comprising:

using an optical amplifier as a light source for generating said spontaneous emission;

inputting to said optical amplifier a spontaneous emission having a bandwidth larger than the transmission bandwidth of said optical filter and including the center transmission wavelength of said optical filter in this band in order to increase, in said optical amplifier, the probability density of light emission of said single-mode light near the center transmission wavelength, and using said optical filter to filter the spontaneous emission amplified by said optical amplifier; and the steps of filtering said spontaneous emission using a first optical filter having at least the transmission bandwidth of said particular band, using the optical amplifier to amplify a light transmitted through said first optical filter, and filtering the amplified light from said optical amplifier using a second optical filter having at least the transmission bandwidth of said particular band, in order to obtain a light transmitted through said second optical filter as said single-mode light.

10. A light generation method as claimed in claim 9 wherein said second optical filter has a center transmission wavelength identical to the center transmission wavelength of the transmission band of said first optical filter and has a transmission bandwidth smaller than or identical to the transmission bandwidth of said first optical filter.

11. A light generation method for outputting a single-mode light having wavelength components in a particular band of a spontaneous emission band by obtaining the single-mode light from a spontaneous emission having wavelength components over a wide-band in a wavelength domain, wherein said single-mode light is obtained by carrying out, at least once, the process of:

the steps of filtering said spontaneous emission using an optical filter having at least the transmission bandwidth of said particular band, using the optical amplifier to amplify a light transmitted through said optical filter, and feeding the light back to said optical filter to obtain a light transmitted through said optical filter as said single-mode light.

12. A light generation method as claimed in claim 9, wherein said filtering is carried out when a center transmission wavelength is provided as an instructive value, by reading data of center transmission wavelengths versus control parameters of optical filters, from a data-storage device with this data stored therein and controlling said optical filter based on the read data so that the center transmission wavelength of the transmission band of said optical filter equals the center transmission wavelength provided as the instructive value.

13. A light generation method as claimed in claim 10, wherein said filtering is carried out when a center transmission wavelength is provided as an instructive value, by reading data of center transmission wavelengths versus control parameters of optical filters, from a data-storage device with this data stored therein and controlling said optical filter based on the read data so that the center transmission wavelength of the transmission band of said optical filter equals the center transmission wavelength provided as the instructive value.

14. A light generation method as claimed in claim 11, wherein said filtering is carried out when a center transmission wavelength is provided as an instructive value, by reading data of center transmission wavelengths versus control parameters of optical filters, from a data-storage device with this data stored therein and controlling said optical filter based on the read data so that the center transmission wavelength of the transmission band of said optical filter equals the center transmission wavelength provided as the instructive value.

15. A light generation method as claimed in claim 9, wherein said optical filter is a disc-shaped optical filter having a predetermined transmission bandwidth and a circularly changed central transmission wavelength, and carries out filtering by varying the center transmission wavelength depending on a rotation angle of the disc-shaped filter in such a manner that light is incident on a surface of the disc-shaped filter at a fixed position thereof to pass through in a rotation axis direction, wherein:

said filtering is carried out when a center transmission wavelength is provided as an instructive value, by reading data of center transmission wavelengths versus control parameters of optical filters, from a data-storage device with this data stored therein, the data comprising different center transmission wavelengths of the optical filter associated with corresponding rotation speeds of the disc-shaped filter, and controlling the rotation angle of the disc-shaped filter of said optical filter based on the read data so that the center transmission wavelength of the transmission band of said optical filter equals the center transmission wavelength provided as the instructive value.

16. A light generation method as claimed in claim 10, wherein said optical filter is a disc-shaped optical filter having a predetermined transmission bandwidth and a circularly changed central transmission wavelength, and carries out filtering by changing the center transmission wavelength depending on a rotation angle of the disc-shaped filter in such a manner that light is incident on a surface of the disc-shaped filter at a fixed position thereof to pass through in a rotation axis direction, wherein:

said filtering is carried out when a center transmission wavelength is provided as an instructive value, by reading data of center transmission wavelengths versus control parameters of optical filters, from a data-storage device with this data stored therein, the data comprising different center transmission wavelengths of the optical filter associated with corresponding rotation speeds of the disc-shaped filter, and controlling the rotation angle of the disc-shaped filter of said optical filter based on the read data so that the center transmission wavelength of the transmission band of said optical filter equals the center transmission wavelength provided as the instructive value.

17. A light generation method as claimed in claim 11, wherein said optical filter is a disc-shaped optical filter having a predetermined transmission bandwidth and a circularly changed central transmission wavelength, and carries out filtering by varying the center transmission wavelength depending on a rotation angle of the disc-shaped filter in such a manner that light is incident on a surface of the disc-shaped filter at a fixed position thereof to pass through in a rotation axis direction, wherein:

said filtering is carried out when a center transmission wavelength is provided as an instructive value, by reading data of center transmission wavelengths versus control parameters of optical filters, from a data-storage device with this data stored therein, the data comprising different center transmission wavelengths of the optical filter associated with corresponding rotation speeds of the disc-shaped filter, and controlling the rotation angle of the disc-shaped filter of said optical filter based on the read data so that the center transmission wavelength of the transmission band of said optical filter equals the center transmission wavelength provided as the instructive value.

18. A light source for outputting a single-mode light by using an optical filter to filter a white-light having wavelength components over a wide-band in a wavelength domain, wherein said single-mode light is obtained by carrying out, at least once, the process of:

using an optical amplifier as a light source for generating said white-light;

filtering said optical amplifier using the optical filter; and using the amplifier to amplify a light transmitted through the optical filter and filtering the amplified light transmitted through the optical filter using an optical filter having a center transmission wavelength equal to the center transmission wavelength of said optical filter.

19. A light source for outputting a single-mode light by using an optical filter to filter a white-light having wavelength components over a wide-band in a wavelength domain, comprising:

using an optical amplifier as a light source for generating said white-light;

using an optical power divider to divide a light transmitted through the optical filter into two and providing an optical path through which one of the lights obtained by means of division is fed back to said optical amplifier, in order to form an optical ring;

said optical ring comprising means for circulating a white-light generated by said optical amplifier in a uni-direction and means for adjusting a round-trip gain to restrain laser oscillation; and obtaining single-mode light using, as a light output, that part of the light circulating through said optical ring which corresponds to the other of the lights obtained by means of division by said optical power divider.

20. A light source as claimed in claim 18 wherein the optical amplifier having said gain saturation comprises a semiconductor optical amplifier.

21. A light source as claimed in claim 19 wherein the optical amplifier having said gain saturation comprises a semiconductor optical amplifier.

22. A light source as claimed in claim 20 wherein said semiconductor optical amplifier has a polarization controller in its input section to control polarization of an input light so as to provide the largest gain.

23. A light source as claimed in claim 22 wherein said optical filter has another amplifier located in its transmission section.

24. A light source as claimed in claim 20 wherein said optical filter comprises a disc-shaped planar substrate and filters a parallel light passing through the disc perpendicularly or almost perpendicularly to its surf ace in such a manner that the center transmission wavelength is varied using as a variable a viewing-angle around a rotation symmetry axis of the disc, wherein:

the filtering effect of said optical filter is provided by a dielectric multilayer film band transmission optical filter having a cavity layer thickness proportional or generally proportional to the viewing-angle, wherein:

the light source includes viewing-angle detection means comprising detection of a mark having means for determining said viewing-angle which is written on the disc, wherein:

data of center transmission wavelength versus control parameters of optical filters is stored in the data-storage device using as variables said viewing-angle and a temperature measured near said optical filter, wherein:

when a center transmission wavelength is provided as an instructive value, said data is read from said data-storage device and the viewing-angle of said optical filter are controlled so that the center transmission wavelength of said optical filter equals the instructive value, and wherein:

the temperature measured near said optical filter is detected to constantly fine-tune the viewing-angle of said optical filter so that the center transmission wavelength of said optical filter equals the instructive value.

25. A light source as claimed in claim 21 wherein said optical filter comprises a disc-shaped planar substrate and filters a parallel light passing through the disc perpendicularly or almost perpendicularly to its surface in such a manner that the center transmission wavelength is varied using as a variable a viewing-angle around a rotation symmetry axis of the disc, wherein:

the filtering effect of said optical filter is provided by a dielectric multilayer film band transmission optical filter having a cavity layer thickness proportional or generally proportional to the viewing-angle, wherein:

the light source includes viewing-angle detection means comprising detection of a mark having means for determining said viewing-angle which is written on the disc, wherein:

data of center transmission wavelength versus control parameters of optical filters is stored in the data-storage device using as variables said viewing-angle and a temperature measured near said optical filter, wherein:

when a center transmission wavelength is provided as an instructive value, said data is read from said data-storage device and the viewing-angle of said optical filter are controlled so that the center transmission wavelength of said optical filter equals the instructive value, and wherein:

the temperature measured near said optical filter is detected to constantly fine-tune the viewing-angle of said optical filter so that the center transmission wavelength of said optical filter equals the instructive value.

26. A light source as claimed in claim 22 wherein said optical filter comprises a disc-shaped planar substrate and filters a parallel light passing through the disc perpendicularly or almost perpendicularly to its surface in such a manner that the center transmission wavelength is varied using as a variable a viewing-angle around a rotation symmetry axis of the disc, wherein:

the filtering effect of said optical filter is provided by a dielectric multilayer film band transmission optical filter having a cavity layer thickness proportional or generally proportional to the viewing-angle, wherein:

the light source includes viewing-angle detection means comprising detection of a mark having means for determining said viewing-angle which is written on the disc, wherein:

data of center transmission wavelength versus control parameters of optical filters is stored in the data-storage device using as variables said viewing-angle and a temperature measured near said optical filter, wherein:

when a center transmission wavelength is provided as an instructive value, said data is read from said data-storage device and the viewing-angle of said optical filter are controlled so that the center transmission wavelength of said optical filter equals the instructive value, and wherein:

the temperature measured near said optical filter is detected to constantly fine-tune the viewing-angle of said optical filter so that the center transmission wavelength of said optical filter equals the instructive value.

27. A light source as claimed in claim 23 wherein said optical filter comprises a disc-shaped planar substrate and filters a parallel light passing through the disc perpendicularly or almost perpendicularly to its surface in such a manner that the center transmission wavelength is varied using as a variable a viewing-angle around a rotation symmetry axis of the disc, wherein:

the filtering effect of said optical filter is provided by a dielectric multilayer film band transmission optical filter having a cavity layer thickness proportional or generally proportional to the viewing-angle, wherein:

the light source includes viewing-angle detection means comprising detection of a mark having means for determining said viewing-angle which is written on the disc, wherein:

data of center transmission wavelength versus control parameters of optical filters is stored in the data-storage device using as variables said viewing-angle and a temperature measured near said optical filter, wherein:

when a center transmission wavelength is provided as an instructive value, said data is read from said data-storage device and the viewing-angle of said optical filter are controlled so that the center transmission wavelength of said optical filter equals the instructive value, and wherein:

the temperature measured near said optical filter is detected to constantly fine-tune the viewing-angle of said optical filter so that the center transmission wavelength of said optical filter equals the instructive value.

28. A light source as claimed in claim 24 wherein means for controlling the viewing-angle of said disc-shaped optical filter comprises an ultrasonic motor.

29. A light source as claimed in claim 20 wherein said optical filter is an acoustooptical filter for controlling the center transmission wavelength depending on the frequency of an electrical oscillator, wherein:

the data-storage device for storing data of center transmission wavelength versus control parameters of optical filters stores as this data, the center transmission frequency using the frequency as a variable, and wherein:

when a center transmission wavelength is provided as an instructive value, said data is read from said data-storage device and the frequency of the electrical oscillator for controlling said optical filter is controlled so that the center transmission wavelength of said optical filter equals the instructive value.

30. A light source as claimed in claim 21 wherein said optical filter is an acoustooptical filter for controlling the center transmission wavelength depending on the frequency of an electrical oscillator, wherein:

the data-storage device for storing data of center transmission wavelength versus control parameters of optical filters stores as this data, the center transmission frequency using the frequency as a variable, and wherein:

when a center transmission wavelength is provided as an instructive value, said data is read from said data-storage device and the frequency of the electrical oscillator for controlling said optical filter is controlled so that the center transmission wavelength of said optical filter equals the instructive value.

31. A light source as claimed in claim 22 wherein said optical filter is an acoustooptical filter for controlling the center transmission wavelength depending on the frequency of an electrical oscillator, wherein:

the data-storage device for storing data of center transmission wavelength versus control parameters of optical filters stores as this data, the center transmission frequency using the frequency as a variable, and wherein:

when a center transmission wavelength is provided as an instructive value, said data is read from said data-storage device and the frequency of the electrical oscillator for controlling said optical filter is controlled so that the center transmission wavelength of said optical filter equals the instructive value.

32. A light source as claimed in claim 23 wherein said optical filter is an acoustooptical filter for controlling the center transmission wavelength depending on the frequency of an electrical oscillator, wherein:

the data-storage device for storing data of center transmission wavelength versus control parameters of optical filters stores as this data, the center transmission frequency using the frequency as a variable, and wherein:

when a center transmission wavelength is provided as an instructive value, said data is read from said data-storage device and the frequency of the electrical oscillator for controlling said optical filter is controlled so that the center transmission wavelength of said optical filter equals the instructive value.

33. A light source wherein one or more optical amplifying media, an optical filter, an optical power divider, and an optical attenuator are connected together in the form of a ring to form an optical ring, wherein:

at least one of said optical amplifying media has gain saturation, wherein:

the attenuation of said optical attenuator is adjusted in such a manner that a mode circulating through said optical ring has a value smaller than or equal to a laser oscillation threshold, and wherein:

a single-mode light of a frequency selected by said optical filter is divided and output from said optical power divider.

34. A light source as claimed in claim 33 wherein said optical amplifying media comprise an optical fiber amplifier for generating a white-light of a wide-band and a semiconductor optical amplifier having gain saturation, and wherein said optical fiber amplifier, said optical filter, and said semiconductor optical amplifier are arranged in this order in an advancing direction of a light circulating through said optical ring.

35. A light source as claimed in claim 33 wherein said optical amplifying media comprise an optical fiber amplifier for generating a wide-band white-light and a semiconductor optical amplifier having gain saturation, and wherein said optical filter, said optical fiber amplifier, and said semiconductor optical amplifier are arranged in this order in the advancing direction of the light circulating through said optical ring.

36. A light source as claimed in claim 33 wherein said optical amplifying media comprise a two-stage optical fiber amplifier for generating a wide-band white-light and a semiconductor optical amplifier having gain saturation, wherein said first optical fiber amplifier, said optical filter, said second optical fiber amplifier, and said semiconductor optical amplifier are arranged in this order in the advancing direction of the light circulating through said optical ring.

37. A light source as claimed in claim 33 wherein said optical filter is a continuous-wavelength-tunable optical filter having its center transmission wavelength swept in synchronism with an externally supplied clock signal.

38. A light source as claimed in claim 34 wherein said optical filter is a continuous-wavelength-tunable optical filter having its center transmission wavelength swept in synchronism with an externally supplied clock signal.

39. A light source as claimed in claim 35 wherein said optical filter is a continuous-wavelength-tunable optical filter having its center transmission wavelength swept in synchronism with an externally supplied clock signal.

40. A light source as claimed in claim 36 wherein said optical filter is a continuous-wavelength-tunable optical filter having its center transmission wavelength swept in synchronism with an externally supplied clock signal.

41. A light source as claimed in claim 33 wherein said optical filter is an acousto-optical wavelength-tunable optical filter having its center transmission wavelength-tunable depending on the frequency of an applied electric signal, said optical filter sweeps the center transmission wavelength by sweeping said electric signal in synchronism with an externally supplied clock signal.

42. A light source as claimed in claim 34 wherein said optical filter is an acousto-optical wavelength-tunable optical filter having its center transmission wavelength-tunable depending on the frequency of an applied electric signal, said optical filter sweeps the center transmission wavelength by sweeping said electric signal in synchronism with an externally supplied clock signal.

43. A light source as claimed in claim 35 wherein said optical filter is an acousto-optical wavelength-tunable optical filter having its center transmission wavelength-tunable depending on the frequency of an applied electric signal, said optical filter sweeps the center transmission wavelength by sweeping said electric signal in synchronism with an externally supplied clock signal.

44. A light source as claimed in claim 36 wherein said optical filter is an acousto-optical wavelength-tunable optical filter having its center transmission wavelength-tunable depending on the frequency of an applied electric signal, said optical filter sweeps the center transmission wavelength by sweeping said electric signal in synchronism with an externally supplied clock signal.

45. A light source as claimed in claim 34 wherein said optical filter is an array waveguide grating filter, comprising:

a plurality of semiconductor optical amplifiers for inputting lights of corresponding wavelengths obtained by means of division by said array waveguide grating filter, a plurality of optical power division sections, a plurality of optical attenuators, and an optical combiner for combining output lights from said plurality of optical attenuators.

46. A light source as claimed in claim 45 wherein said optical combiner comprises said array waveguide grating filter for dividing a white-light.

* * * * *